(12) United States Patent
Itasaka

(10) Patent No.: US 12,119,790 B2
(45) Date of Patent: Oct. 15, 2024

(54) CIRCUIT DEVICE AND OSCILLATOR

(71) Applicant: SEIKO EPSON CORPORATION, Tokyo (JP)

(72) Inventor: Yosuke Itasaka, Minowa (JP)

(73) Assignee: SEIKO EPSON CORPORATION (JP)

( * ) Notice: Subject to any disclaimer, the term of this patent is extended or adjusted under 35 U.S.C. 154(b) by 49 days.

(21) Appl. No.: 17/986,931

(22) Filed: Nov. 15, 2022

(65) Prior Publication Data

US 2023/0155551 A1 May 18, 2023

(30) Foreign Application Priority Data

Nov. 16, 2021 (JP) ................. 2021-186166

(51) Int. Cl.
*H03B 5/36* (2006.01)
*H03B 5/04* (2006.01)

(52) U.S. Cl.
CPC ............... *H03B 5/364* (2013.01); *H03B 5/04* (2013.01); *H03B 2200/004* (2013.01); *H03B 2201/0266* (2013.01)

(58) Field of Classification Search
CPC .................................................. H03B 5/363
USPC ........................................................ 331/66
See application file for complete search history.

(56) References Cited

U.S. PATENT DOCUMENTS

| | | | |
|---|---|---|---|
| 11,342,883 B1* | 5/2022 | Lin | ............... H03B 5/124 |
| 2004/0257143 A1* | 12/2004 | Ke | ............... H03B 5/04 |
| | | | 327/337 |

FOREIGN PATENT DOCUMENTS

JP   H07-226679 A   8/1995

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit. The oscillation circuit includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and oscillates a resonator. The circuit device further includes a switch circuit. The switch circuit receives a first input voltage at a first input terminal thereof, receives a second input voltage at a second input terminal thereof, outputs a first output voltage selected from a plurality of voltages including the first input voltage and the second input voltage to a first output terminal thereof to which the first variable capacitance circuit is electrically coupled, and outputs a second output voltage selected from the plurality of voltages to a second output terminal thereof to which the second variable capacitance circuit is electrically coupled.

12 Claims, 17 Drawing Sheets

FIG. 6

| SW1 | SW1D | SW1U | SW12 | SW2 | SW2D | SW2U | SW21 | VQ1 | VQ2 | FIRST VARIABLE CAPACITANCE CIRCUIT | SECOND VARIABLE CAPACITANCE CIRCUIT | MODE |
|---|---|---|---|---|---|---|---|---|---|---|---|---|
| 1 | 0 | 0 | 0 | 1 | 0 | 0 | 0 | VCP | VFC | TEMPERATURE COMPENSATION | FREQUENCY CONTROL | VC-TCXO |
| 1 | 0 | 0 | 0 | 0 | 1 | 0 | 0 | VCP | GND | TEMPERATURE COMPENSATION | SET TO HIGH CL | TCXO |
| 1 | 0 | 0 | 0 | 0 | 0 | 1 | 0 | VCP | VREF | TEMPERATURE COMPENSATION | SET TO LOW CL | TCXO |
| 0 | 1 | 0 | 0 | 1 | 0 | 0 | 0 | GND | VFC | SET TO LOW CL | FREQUENCY CONTROL | VCXO |
| 0 | 1 | 0 | 0 | 0 | 1 | 0 | 0 | GND | GND | SET TO LOW CL | SET TO HIGH CL | SPXO |
| 0 | 1 | 0 | 0 | 0 | 0 | 1 | 0 | GND | VREF | SET TO LOW CL | SET TO LOW CL | SPXO |
| 0 | 1 | 0 | 0 | 0 | 0 | 0 | 1 | GND | VCP | SET TO LOW CL | INVERTED TEMPERATURE COMPENSATION | INVERTED TCXO |
| 0 | 0 | 1 | 0 | 1 | 0 | 0 | 0 | VREF | VFC | SET TO HIGH CL | FREQUENCY CONTROL | VCXO |
| 0 | 0 | 1 | 0 | 0 | 1 | 0 | 0 | VREF | GND | SET TO HIGH CL | SET TO HIGH CL | SPXO |
| 0 | 0 | 1 | 0 | 0 | 0 | 1 | 0 | VREF | VREF | SET TO HIGH CL | SET TO LOW CL | SPXO |
| 0 | 0 | 1 | 0 | 0 | 0 | 0 | 1 | VREF | VCP | SET TO HIGH CL | INVERTED TEMPERATURE COMPENSATION | INVERTED TCXO |
| 0 | 0 | 0 | 1 | 0 | 1 | 0 | 0 | VFC | GND | INVERTED FREQUENCY CONTROL | SET TO HIGH CL | INVERTED VCXO |
| 0 | 0 | 0 | 1 | 0 | 0 | 1 | 0 | VFC | VREF | INVERTED FREQUENCY CONTROL | SET TO LOW CL | INVERTED VCXO |
| 0 | 0 | 0 | 1 | 0 | 0 | 0 | 1 | VFC | VCP | INVERTED FREQUENCY CONTROL | INVERTED TEMPERATURE COMPENSATION | INVERTED VC-INVERTED TCXO |

CIRCUIT DEVICE AND OSCILLATOR

The present application is based on, and claims priority from JP Application Serial Number 2021-186166, filed Nov. 16, 2021, the disclosure of which is hereby incorporated by reference herein in its entirety.

BACKGROUND

1. Technical Field

The present disclosure relates to a circuit device, an oscillator and the like.

2. Related Art

In a circuit device that oscillates a resonator such as a quartz crystal resonator, a variable capacitance circuit for adjusting an oscillation frequency is provided. For example, in an oscillation circuit disclosed in JP-A-H07-226679, an inverting amplifier that inverts polarity of a control voltage is provided between a voltage controlled oscillator that changes an oscillation frequency according to the control voltage and an amplifier that outputs the control voltage.

In the related art of JP-A-H07-226679, an operation by negative feedback control is enabled without changing polarity of a control element in an oscillator or separately preparing a non-standard oscillator. However, a circuit device and an oscillator capable of implementing various operation modes by using variable capacitance circuits having different polarities of voltage capacitance characteristics have not been proposed.

SUMMARY

An aspect of the present disclosure relates to a circuit device, the circuit device including: an oscillation circuit that includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and that oscillates a resonator; and a switch circuit configured to receive a first input voltage at a first input terminal thereof, receive a second input voltage at a second input terminal thereof, output a first output voltage selected from a plurality of voltages including the first input voltage and the second input voltage to a first output terminal thereof to which the first variable capacitance circuit is electrically coupled, and output a second output voltage selected from the plurality of voltages to a second output terminal thereof to which the second variable capacitance circuit is electrically coupled.

Another aspect of the present disclosure relates to a circuit device, the circuit device including: an oscillation circuit that includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and that oscillates a resonator; and a frequency control circuit configured to output a frequency control voltage for an oscillation frequency of the oscillation circuit. In a first mode, the frequency control voltage is input as the capacitance control voltage to the second variable capacitance circuit, and in a second mode, the frequency control voltage is input as the capacitance control voltage to the first variable capacitance circuit.

Another aspect of the present disclosure relates to an oscillator, the oscillator including: a resonator; and a circuit device. The circuit device includes: an oscillation circuit that includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and that oscillates the resonator; and a switch circuit configured to receive a first input voltage at a first input terminal thereof, receive a second input voltage at a second input terminal thereof, output a first output voltage selected from a plurality of voltages including the first input voltage and the second input voltage to a first output terminal thereof to which the first variable capacitance circuit is coupled, and output a second output voltage selected from the plurality of voltages to a second output terminal to which the second variable capacitance circuit is coupled.

Another aspect of the present disclosure relates to an oscillator, the oscillator including: a resonator; and a circuit device. The circuit device includes: an oscillation circuit that includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and that oscillates the resonator; and a frequency control circuit configured to output a frequency control voltage for an oscillation frequency of the oscillation circuit. In a first mode, the frequency control voltage is input as the capacitance control voltage to the second variable capacitance circuit, and in a second mode, the frequency control voltage is input as the capacitance control voltage to the first variable capacitance circuit.

BRIEF DESCRIPTION OF THE DRAWINGS

FIG. 6 is a table illustrating setting of operation modes of the switch circuit.

DESCRIPTION OF EXEMPLARY EMBODIMENTS

Hereinafter, the present embodiment will be described. The present embodiment to be described below does not unduly limit contents described in the claims. All configurations described in the present embodiment are not necessarily essential constituent elements.

1. Circuit Device

Figure 1:
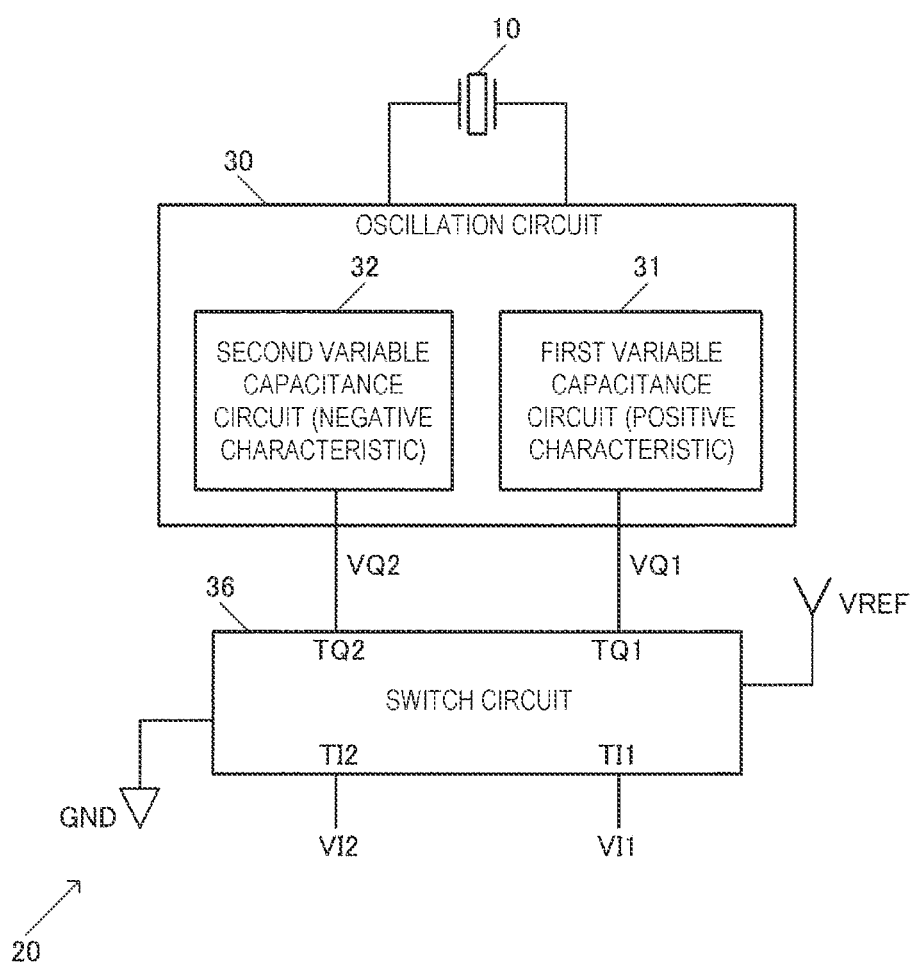
FIG. 1 is a diagram illustrating a configuration example of a circuit device and an oscillator according to the present embodiment.

FIG. 1 is a diagram illustrating a configuration example of a circuit device 20 according to the present embodiment. The circuit device 20 according to the present embodiment includes an oscillation circuit 30 and a switch circuit 36. An oscillator 4 according to the present embodiment includes a resonator 10 and the circuit device 20. The resonator 10 is electrically coupled to the circuit device 20.

The resonator 10 is an element that generates mechanical oscillation according to an electrical signal. The resonator 10 can be implemented by, for example, a resonator element such as a quartz crystal resonator element. For example, the resonator 10 can be implemented by a quartz crystal resonator element that has a cut angle of AT cut, SC cut, or the like and that performs thickness-shear oscillation, a tuning fork type quartz crystal resonator element, or a double-tuning fork type quartz crystal resonator element. For example, the resonator 10 may be a resonator built in a temperature compensated crystal oscillator (TCXO) not provided with an oven, or may be a resonator built in an oven controlled crystal oscillator (OCXO) provided with an oven. Alternatively, the resonator 10 may be a resonator built in a simple packaged crystal oscillator (SPXO). The vibrator 10 according to the present embodiment can be implemented by various resonator elements such as a resonator element other than a thickness-shear oscillating type, a tuning fork type, or a double-tuning fork type, and a piezoelectric resonator element formed of a material other than quartz crystal. For example, a surface acoustic wave (SAW) resonator, or a micro electro mechanical systems (MEMS) resonator as a silicon resonator formed using a silicon substrate may be employed as the resonator 10.

The circuit device 20 is an integrated circuit device called an integrated circuit (IC). For example, the circuit device 20 is an IC manufactured by a semiconductor process, and is a semiconductor chip in which a circuit element is formed on a semiconductor substrate. In FIG. 1, the circuit device 20 includes the oscillation circuit 30 and the switch circuit 36, and the oscillation circuit 30 includes a first variable capacitance circuit 31 and a second variable capacitance circuit 32.

The oscillation circuit 30 is a circuit that oscillates the resonator 10. For example, the oscillation circuit 30 oscillates the resonator 10 to generate an oscillation signal. The oscillation signal is an oscillation clock signal. For example, the oscillation circuit 30 can be implemented by an oscillation drive circuit electrically coupled to one end and the other end of the resonator 10, and a passive element such as a capacitor and a resistor. The drive circuit can be implemented by, for example, a CMOS inverter circuit or a bipolar transistor. The drive circuit is a core circuit of the oscillation circuit 30, and the drive circuit oscillates the resonator 10 by driving the resonator 10 with a voltage or a current. As the oscillation circuit 30, various types of oscillation circuits such as an inverter type, a Pierce type, a Colpitts type, and a Hartley type can be used. Note that coupling in the present embodiment is electrical coupling. The electrical coupling is coupling in which electrical signals can be transmitted, and is coupling in which information can be transmitted by the electrical signals. The electrical coupling may be coupling established via a passive element or the like.

The oscillation circuit 30 includes the first variable capacitance circuit 31 and the second variable capacitance circuit 32. The first variable capacitance circuit 31 and the second variable capacitance circuit 32 are, for example, circuits that change a capacitance formed at least at one of one end and the other end of the resonator 10, and an oscillation frequency of the oscillation circuit 30 can be adjusted by adjusting capacitances of the first variable capacitance circuit 31 and the second variable capacitance circuit 32. The first variable capacitance circuit 31 and the second variable capacitance circuit 32 can be implemented by a variable capacitance element such as a varactor. For example, each of the first variable capacitance circuit 31 and the second variable capacitance circuit 32 includes at least one variable capacitance element.

The switch circuit 36 is a circuit that supplies a capacitance control voltage to the first variable capacitance circuit 31 and the second variable capacitance circuit 32 of the oscillation circuit 30. The switch circuit 36 receives a first input voltage VI1 and a second input voltage VI2 and outputs a first output voltage VQ1 and a second output voltage VQ2. The first output voltage VQ1 and the second output voltage VQ2 are respectively supplied to the first variable capacitance circuit 31 and the second variable capacitance circuit 32 as capacitance control voltages. The switch circuit 36 includes, for example, a plurality of switch elements. In FIG. 1, a reference voltage VREF and a ground voltage GND, which are fixed voltages, are supplied to the switch circuit 36.

In the present embodiment, the oscillation circuit 30 includes the first variable capacitance circuit 31 whose capacitance change characteristic with respect to the capacitance control voltage is a positive characteristic, and the second variable capacitance circuit 32 whose capacitance change characteristic with respect to the capacitance control voltage is a negative characteristic. For example, the first variable capacitance circuit 31 and the second variable capacitance circuit 32 have different polarities of capacitance change characteristic with respect to the capacitance control voltage, that is, one has a positive capacitance change characteristic and the other has a negative capacitance change characteristic. The positive capacitance change characteristic refers to, for example, a change characteristic that the capacitance increases as the capacitance control voltage increases, as will be described later with reference to FIG. 3. The negative capacitance change characteristic refers to, for example, a change characteristic that the capacitance decreases as the capacitance control voltage increases, as will be described later with reference to FIG. 4. The capacitance can also be referred to as a capacitance value.

In the switch circuit 36, the first input voltage VI1 is input to a first input terminal TI1, and the second input voltage VI2 is input to a second input terminal TI2. The first input voltage VI1 and the second input voltage VI2 are, for example, voltages input from a predetermined circuit in the circuit device 20. Alternatively, the first input voltage VI1 and the second input voltage VI2 may be voltages input from the outside of the circuit device 20. The switch circuit 36 outputs the first output voltage VQ1, which is selected from a plurality of voltages including the first input voltage VI1 and the second input voltage VI2, to a first output terminal TQ1 to which the first variable capacitance circuit 31 is electrically coupled. The switch circuit 36 outputs a second output voltage VQ2, which is selected from a plurality of voltages including the first input voltage VI1 and the second input voltage VI2, to a second output terminal TQ2 to which the second variable capacitance circuit 32 is electrically coupled.

For example, the switch circuit 36 outputs, as the first output voltage VQ1 and the second output voltage VQ2, a voltage selected from the first input voltage VI1 and the second input voltage VI2. In this case, the plurality of voltages serving as selection targets are the first input voltage VI1 and the second input voltage VI2. Alternatively, the switch circuit 36 may output, as the first output voltage VQ1 and the second output voltage VQ2, a voltage selected from the first input voltage VI1, the second input voltage VI2, and one or more fixed voltages. In this case, the plurality of voltages serving as selection targets are the first input voltage VI1, the second input voltage VI2, and the fixed voltage. The fixed voltage is, for example, a voltage having a constant voltage value such as the reference voltage VREF and the ground voltage GND. The switch circuit 36 includes a plurality of switch elements for selecting voltages from the plurality of voltages including the first input voltage VI1 and the second input voltage VI2 and outputting the selected voltages as the first output voltage VQ1 and the second output voltage VQ2. On and off control of each switch element of the plurality of switch elements in this case is performed based on a switch control signal from a control circuit (not illustrated).

In this way, voltages selected from the plurality of voltages including the first input voltage VI1 and the second input voltage VI2 can be output as the first output voltage VQ1 and the second output voltage VQ2 to the first variable capacitance circuit 31 and the second variable capacitance circuit 32, respectively. The oscillation frequency of the oscillation circuit 30 can be adjusted or set by inputting the first output voltage VQ1 as the capacitance control voltage to the first variable capacitance circuit 31 having a positive voltage capacitance characteristic, or the oscillation frequency of the oscillation circuit 30 can be adjusted or set by inputting the second output voltage VQ2 as the capacitance control voltage to the second variable capacitance circuit 32 having a negative voltage capacitance characteristic. For example, it is possible to implement an operation mode in which the first input voltage VI1 is input as the first output voltage VQ1 to the first variable capacitance circuit 31 having a positive characteristic, and the second input voltage VI2 is input as the second output voltage VQ2 to the second variable capacitance circuit 32 having a negative characteristic. Alternatively, for example, it is possible to implement an operation mode in which, conversely, the first input voltage VI1 is input as the second output voltage VQ2 to the second variable capacitance circuit 32 having a negative characteristic, and the second input voltage VI2 is input as the first output voltage VQ1 to the first variable capacitance circuit 31 having a positive characteristic. Alternatively, for example, it is possible to implement an operation mode in which a fixed voltage such as VREF and GND is input as the first output voltage VQ1 to the first variable capacitance circuit 31 having a positive characteristic, or an operation mode in which a fixed voltage such as VREF and GND is input as the second output voltage VQ2 to the second variable capacitance circuit 32 having a negative characteristic. Therefore, it is possible to provide the circuit device 20 and the oscillator 4 capable of implementing various operation modes by using the first variable capacitance circuit 31 and the second variable capacitance circuit 32 having different polarities of voltage capacitance characteristics.

Figure 2:
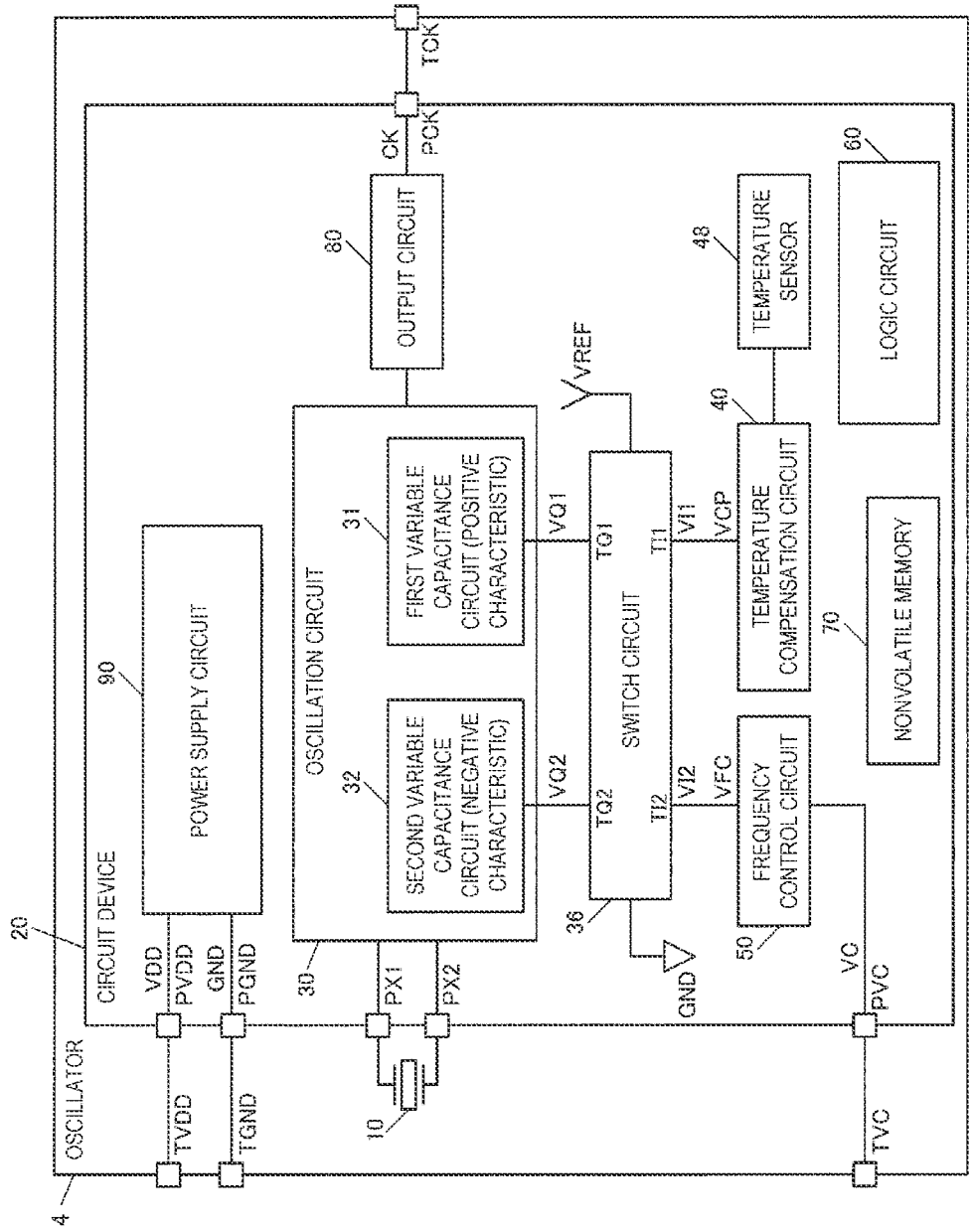
FIG. 2 is a diagram illustrating a detailed configuration example of the circuit device and the oscillator according to the present embodiment.

FIG. 2 is a diagram illustrating a detailed configuration example of the circuit device 20 and the oscillator 4 according to the present embodiment. In FIG. 2, the circuit device 20 includes the oscillation circuit 30, the switch circuit 36, a temperature compensation circuit 40, a temperature sensor 48, a frequency control circuit 50, a logic circuit 60, a nonvolatile memory 70, an output circuit 80, and a power supply circuit 90. The oscillator 4 includes the resonator 10 and the circuit device 20. The resonator 10 is electrically coupled to the circuit device 20. For example, the resonator 10 is electrically coupled to the circuit device 20 by using an internal wiring of a package that accommodates the resonator 10 and the circuit device 20, a bonding wire, or a metal bump. The circuit device 20 and the oscillator 4 are not limited to the configuration in FIG. 2, and various modifications such as omitting some of the components, adding other components, and replacing some of the components with other components can be made.

The circuit device 20 includes pads PVDD, PGND, PX1, PX2, PVC, and PCK. The pad is a terminal of the circuit device 20 that is a semiconductor chip. For example, in a pad region, a metal layer is exposed from a passivation film that is an insulating layer, and the exposed metal layer forms the pad that is a terminal of the circuit device 20. The pads PVDD and PGND are a power supply pad and a ground pad, respectively. A power supply voltage VDD from an external power supply device is supplied to the pad PVDD. The pad PGND is a pad to which GND, which is a ground voltage, is supplied. GND may be referred to as VSS, and the ground voltage is, for example, a ground potential. In the present embodiment, the ground voltage is appropriately described as GND. For example, VDD corresponds to a high potential side power supply, and GND corresponds to a low potential side power supply. The pads PX1 and PX2 are pads for coupling to the resonator 10. The pad PVC is a pad for inputting a control voltage VC, and the pad PCK is a pad for outputting a clock signal CK. The pads PVDD, PGND, PVC, and PCK are electrically coupled to terminals TVDD, TGND, TVC, and TCK, respectively, which are external terminals for external coupling to the oscillator 4. For example, each pad is electrically coupled to a corresponding terminal using an internal wiring of a package, a bonding wire, or a metal bump.

The oscillation circuit 30 is electrically coupled to the resonator 10 via the pads PX1 and PX2. The pads PX1 and PX2 are pads for coupling to the resonator. The oscillation drive circuit of the oscillation circuit 30 is provided between the pad PX1 and the pad PX2. The oscillation circuit 30 includes the first variable capacitance circuit 31 and the second variable capacitance circuit 32. Since the first variable capacitance circuit 31 and the second variable capacitance circuit 32 are electrically coupled to at least one of the pads PX1 and PX2, a load capacitance of the oscillation circuit 30 can be variably adjusted.

The temperature compensation circuit 40 is a circuit that performs temperature compensation for the oscillation frequency of the oscillation circuit 30. For example, the temperature compensation circuit 40 outputs a temperature compensation voltage VCP for temperature compensating the oscillation frequency of the oscillation circuit 30, based on a temperature detection result of the temperature sensor 48. The temperature detection result is a temperature detection signal, and is, for example, a temperature detection voltage. The temperature compensation is, for example, processing of performing compensation by reducing a fluctuation in oscillation frequency caused by a temperature fluctuation. That is, the temperature compensation circuit 40 performs temperature compensation for the oscillation frequency of the oscillation circuit 30 such that the oscillation frequency is constant even when a temperature fluctuation occurs.

Specifically, the temperature compensation circuit 40 performs analog temperature compensation according to polynomial approximation, for example. For example, when the temperature compensation voltage VCP for compensating a frequency-temperature characteristic of the resonator 10 is approximated by using a polynomial, the temperature compensation circuit 40 performs the analog temperature compensation based on coefficient information of the polynomial. The analog temperature compensation is, for example, temperature compensation implemented by addition processing of a current signal or a voltage signal that is an analog signal. For example, when the temperature compensation voltage VCP is approximated by using a high-order polynomial, a zero-order coefficient, a linear coefficient, and a high-order coefficient of the polynomial are stored in a storage unit implemented by, for example, the nonvolatile memory 70 as zero-order correction data, linear correction data, and high-order correction data, respectively. The high-order coefficient is, for example, a coefficient of an order higher than the first order, and the high-order correction data is correction data corresponding to the high-order coefficient. For example, when the temperature compensation voltage VCP is approximated by using a cubic polynomial, a zero-order coefficient, a linear coefficient, a quadratic coefficient, and a cubic coefficient of the polynomial are stored in the storage unit as zero-order correction data, linear correction data, quadratic correction data, and cubic correction data. Then, the temperature compensation circuit 40 performs temperature compensation based on the zero-order correction data to the cubic correction data. In this case, the quadratic correction data and temperature compensation based on the quadratic correction data may be omitted. For example, when the temperature compensation voltage VCP is approximated by using a quintic polynomial, a zero-order coefficient, a linear coefficient, a quadratic coefficient, a cubic coefficient, a quartic coefficient, and a quintic coefficient of the polynomial are stored in the storage unit as zero-order correction data, linear correction data, quadratic correction data, cubic correction data, quartic correction data, and quintic correction data. Then, the temperature compensation circuit 40 performs temperature compensation based on the zero-order correction data to the quintic correction data. In this case, the quadratic correction data or the quartic correction data, and the temperature compensation based on the quadratic correction data or the quartic correction data may be omitted. The order of polynomial approximation is any, and for example, polynomial approximation of an order higher than the fifth order may be performed. The zero-order correction may be performed by the temperature sensor 48.

The temperature sensor 48 is a sensor that detects a temperature. Specifically, the temperature sensor 48 outputs, as a temperature detection voltage, a temperature dependent voltage that changes in accordance with an environmental temperature. For example, the temperature sensor 48 generates a temperature detection voltage, which is a temperature detection signal, by using a circuit element having temperature dependency. Specifically, the temperature sensor 48 outputs the temperature detection voltage, which changes depending on the temperature by using, for example, temperature dependence of a forward voltage of a PN junction. Although the temperature sensor 48 is provided in the circuit device 20 in FIG. 2, a modification may be made in which the temperature sensor 48 is provided outside the circuit device 20 and the temperature compensation circuit 40 performs temperature compensation based on a temperature detection signal such as a temperature detection voltage input from the outside. A modification in which a digital temperature sensor circuit is used as the temperature sensor 48 is also possible. In this case, the temperature detection voltage may be generated by performing D/A conversion on temperature detection data.

The frequency control circuit 50 is a circuit that controls the oscillation frequency of the oscillation circuit 30. Specifically, the frequency control circuit 50 outputs a frequency control voltage VFC for the oscillation frequency. For example, the frequency control circuit 50 generates the frequency control voltage VFC based on a control voltage input from the outside, and outputs the generated frequency control voltage VFC. Alternatively, the frequency control circuit 50 may generate the frequency control voltage VFC based on a control voltage obtained by performing D/A conversion on control data input from the outside. By providing such a frequency control circuit 50, it is possible to implement control of setting the oscillation frequency of the oscillation circuit 30 to a desired frequency. For example, by providing the temperature compensation circuit 40 and the frequency control circuit 50, it is possible to set the oscillation frequency to a desired frequency according to the control voltage and the control data input from the outside while performing temperature compensation for the oscillation frequency.

Specifically, a control voltage VC from the outside is input to the frequency control circuit 50. For example, the control voltage VC from an external system implemented by a microcomputer or various ICs is input to the frequency control circuit 50 via the terminal TVC and the pad PVC. As an example, the oscillation circuit 30 of the circuit device 20 functions as a voltage controlled oscillator, and a feedback loop of PLL is formed by an external system. The frequency control circuit 50 outputs the frequency control voltage VFC corresponding to the control voltage VC from the outside. For example, the frequency control circuit 50 outputs the frequency control voltage VFC obtained by gain-adjusting the control voltage VC. Digital control data may be input to the circuit device 20 via an interface circuit (not illustrated), and the control voltage VC obtained by D/A converting the digital control data may be input to the frequency control circuit 50.

The logic circuit 60 is a control circuit and performs various types of control processing. For example, the logic circuit 60 controls the entire circuit device 20 or controls an operation sequence of the circuit device 20. The logic circuit 60 performs various types of processing for controlling the oscillation circuit 30, controls the temperature sensor 48, the output circuit 80, or the power supply circuit 90, or controls reading and writing of information from and to the nonvolatile memory 70. The logic circuit 60 can be implemented by, for example, an application specific integrated circuit (ASIC) using automatic placement and routing such as a gate array.

The nonvolatile memory 70 is a memory that stores information even without power supply. For example, the nonvolatile memory 70 is a memory that can store information without power supply and in which information can be rewritten. The nonvolatile memory 70 stores various kinds of information necessary for operations of the circuit device 20 and the like. The nonvolatile memory 70 can be implemented by an electrically erasable programmable read-only memory (EEPROM) or the like that is implemented by a floating gate avalanche injection MOS memory (FAMOS memory) or a metal-oxide-nitride-oxide-silicon memory (MONOS memory). The nonvolatile memory 70 stores correction data such as linear correction data and high-order correction data used for temperature compensation of the temperature compensation circuit 40.

The output circuit 80 outputs the clock signal CK based on an oscillation signal from the oscillation circuit 30. For example, the output circuit 80 buffers an oscillation signal, which is an oscillation clock signal from the oscillation circuit 30, and outputs the buffered oscillation signal to the pad PCK as the clock signal CK. The clock signal CK is output to the outside via the clock output terminal TCK of the oscillator 4. For example, the output circuit 80 outputs the clock signal CK in a single-ended CMOS signal format. The output circuit 80 may output the clock signal CK in a signal format other than the CMOS signal format. In addition, a clock signal generation circuit such as a PLL circuit that generates a clock signal CK having a frequency obtained by multiplying a frequency of an oscillation signal may be provided at a subsequent stage of the oscillation circuit 30, and the output circuit 80 may buffer the clock signal CK generated by the clock signal generation circuit and output the buffered clock signal CK.

The power supply circuit 90 is supplied with the power supply voltage VDD from the pad PVDD and the ground voltage GND from the pad PGND, and supplies various power supply voltages for an internal circuit in the circuit device 20 to the internal circuit. For example, the power supply circuit 90 supplies a regulated power supply voltage obtained by regulating the power supply voltage VDD to circuits in the circuit device 20, such as the oscillation circuit 30.

Figure 3:
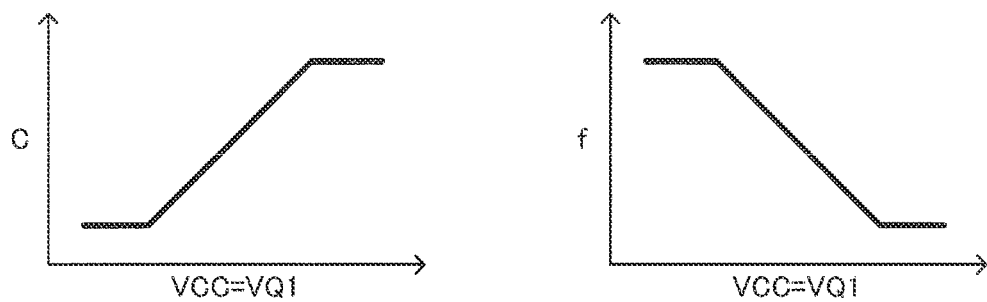
FIG. 3 is a graph illustrating a positive voltage capacitance characteristic of a first variable capacitance circuit.
Figure 4:
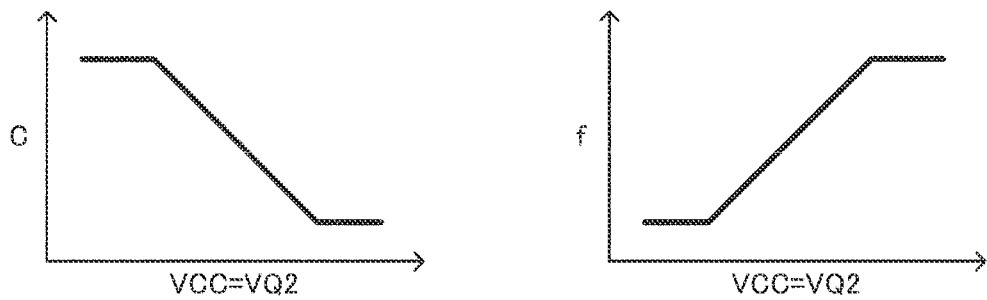
FIG. 4 is a graph illustrating a negative voltage capacitance characteristic of a second variable capacitance circuit.

FIG. 3 is a graph illustrating a positive voltage capacitance characteristic of the first variable capacitance circuit 31. FIG. 4 is a graph illustrating a negative voltage capacitance characteristic of the second variable capacitance circuit 32. The voltage capacitance characteristic is a characteristic of a capacitance C with respect to a capacitance control voltage VCC. Note that FIGS. 3 and 4 schematically illustrate the voltage capacitance characteristic, and actually, the voltage capacitance characteristic is not a linear characteristic as illustrated in FIGS. 3 and 4, but a characteristic having an inflection point at which an inclination is maximum in the vicinity of a center of a change range.

As illustrated in FIG. 3, the first variable capacitance circuit 31 receives, as the capacitance control voltage VCC, the first output voltage VQ1 from the switch circuit 36. According to the positive voltage capacitance characteristic of the first variable capacitance circuit 31, when the first output voltage VQ1 increases, the capacitance C increases, and accordingly an oscillation frequency f of the oscillation circuit 30 decreases. On the other hand, as illustrated in FIG. 4, the second variable capacitance circuit 32 receives, as the capacitance control voltage VCC, the second output voltage VQ2 from the switch circuit 36. According to the negative voltage capacitance characteristic of the second variable capacitance circuit 32, when the second output voltage VQ2 increases, the capacitance C decreases, and accordingly the oscillation frequency f increases.

The circuit device 20 according to the present embodiment in FIG. 2 includes the temperature compensation circuit 40 that outputs the temperature compensation voltage VCP for temperature compensating the oscillation frequency of the oscillation circuit 30. The first input voltage VI1 input to the switch circuit 36 is the temperature compensation voltage VCP from the temperature compensation circuit 40. In this way, in the switch circuit 36, the temperature compensation voltage VCP from the temperature compensation circuit 40 is input as the first input voltage VI1 to the first input terminal TI1, and the temperature compensation voltage VCP can be output as the first output voltage VQ1 to the first variable capacitance circuit 31 having a positive characteristic, or can be output as the second output voltage VQ2 to the second variable capacitance circuit 32 having a negative characteristic. Therefore, with the temperature compensation voltage VCP from the temperature compensation circuit 40, it is possible to perform temperature compensation for the oscillation frequency with the positive voltage capacitance characteristic by using the first variable capacitance circuit 31, or perform temperature compensation for the oscillation frequency with the negative voltage capacitance characteristic by using the second variable capacitance circuit 32.

The circuit device 20 in FIG. 2 includes the frequency control circuit 50 that outputs the frequency control voltage VFC for the oscillation frequency of the oscillation circuit 30. The second input voltage VI2 is the frequency control voltage VFC from the frequency control circuit 50. In this way, in the switch circuit 36, the frequency control voltage VFC from the frequency control circuit 50 is input as the second input voltage VI2 to the second input terminal TI2, and the frequency control voltage VFC can be output as the second output voltage VQ2 to the second variable capacitance circuit 32 having a negative characteristic, or can be output as the first output voltage VQ1 to the first variable capacitance circuit 31 having a positive characteristic. In this way, it is possible to perform control of the oscillation frequency of a positive characteristic or control of the oscillation frequency of a negative characteristic by using the frequency control voltage VFC from the frequency control circuit 50. For example, when the control voltage VC from the outside rises, it is possible to implement the control of the oscillation frequency of a positive characteristic that raises the oscillation frequency, or when the control voltage VC from the outside rises, it is possible to implement the control of the oscillation frequency of a negative characteristic that lowers the oscillation frequency. In this case, the frequency control circuit 50 does not need to be provided with an inverting amplifier that is, for example, an inverting amplifier circuit, and thus a reduction in circuit scale, a reduction in power consumption and the like can be achieved.

Although FIG. 2 illustrates a case where both the temperature compensation circuit 40 and the frequency control circuit 50 are provided, a modification in which only one of the temperature compensation circuit 40 and the frequency control circuit 50 is provided is also possible. For example, if only the temperature compensation circuit 40 is provided without providing the frequency control circuit 50, it is possible to implement the circuit device 20 and the oscillator 4 that do not have a frequency control function based on the control voltage VC but have a temperature compensation function. Alternatively, if only the frequency control circuit 50 is provided without providing the temperature compensation circuit 40, it is possible to implement the circuit device 20 and the oscillator 4 that do not have a temperature compensation function but have a frequency control function based on the control voltage VC, as illustrated in a configuration in FIG. 8 to be described later, for example. In this case, the temperature compensation processing for the oscillation frequency may be performed by an external system, or the oscillator 4 such as an SPXO having no temperature compensation function may be implemented.

A plurality of voltages serving as selection target voltages of the switch circuit 36 include a fixed voltage. For example, in FIG. 2, the plurality of voltages include a fixed voltage such as the reference voltage VREF and the ground voltage GND. The switch circuit 36 outputs the fixed voltage to the first output terminal TQ1 or the second output terminal TQ2. The fixed voltage only needs to be output to the first output terminal TQ1 or the second output terminal TQ2, and the fixed voltage may be output to both the first output terminal TQ1 and the second output terminal TQ2. In this way, when the switch circuit 36 outputs the fixed voltage to the first output terminal TQ1 or the second output terminal TQ2, a capacitance of the first variable capacitance circuit 31 or the second variable capacitance circuit 32 can be set to a fixed capacitance.

For example, when a fixed voltage is output from the first output terminal TQ1 of the switch circuit 36, the capacitance of the first variable capacitance circuit 31 to which the fixed voltage is input is set to be fixed. Therefore, for example, when the frequency control voltage VFC is output from the second output terminal TQ2 of the switch circuit 36, it is possible to implement the frequency control by capacitance control of the second variable capacitance circuit 32 based on the frequency control voltage VFC while setting the capacitance of the first variable capacitance circuit 31 to be fixed. In addition, for example, when a fixed voltage is output from the second output terminal TQ2 of the switch circuit 36, the capacitance of the second variable capacitance circuit 32 to which the fixed voltage is input is set to be fixed. Therefore, for example, when the temperature compensation voltage VCP is output from the first output terminal TQ1 of the switch circuit 36, it is possible to implement the temperature compensation by capacitance control of the first variable capacitance circuit 31 based on the temperature compensation voltage VCP while setting the capacitance of the second variable capacitance circuit 32 to be fixed. In addition, for example, when a fixed voltage is output from both the first output terminal TQ1 and the second output terminal TQ2 of the switch circuit 36, the capacitances of both the first variable capacitance circuit 31 and the second variable capacitance circuit 32 to which the fixed voltage is input are set to be fixed. Accordingly, for example, the circuit device 20 for the SPXO can be implemented.

The switch circuit 36 outputs a high potential side fixed voltage or a low potential side fixed voltage to the first output terminal TQ1 or the second output terminal TQ2 as a fixed voltage. The high potential side fixed voltage is, for example, the reference voltage VREF in FIG. 2. The low potential side fixed voltage is, for example, the ground voltage GND in FIG. 2. However, the present embodiment is not limited thereto, and the high potential side fixed voltage may be VDD that is the power supply voltage, and the low potential side fixed voltage may be a voltage lower than VDD or VREF and higher than GND. In this way, for example, the capacitances of the first variable capacitance circuit 31 and the second variable capacitance circuit 32 can be fixed to a high capacitance or a low capacitance. For example, when the high potential side fixed voltage is output from the first output terminal TQ1, the capacitance of the first variable capacitance circuit 31 having a positive characteristic can be fixed to a large capacitance, and when the low potential side fixed voltage is output from the first output terminal TQ1, the capacitance of the first variable capacitance circuit 31 having a positive characteristic can be fixed to a small capacitance. In addition, when the high potential side fixed voltage is output from the second output terminal TQ2, the capacitance of the second variable capacitance circuit 32 having a negative characteristic can be fixed to a small capacitance, and when the high potential side fixed voltage is output from the second output terminal TQ2, the capacitance of the second variable capacitance circuit 32 having a negative characteristic can be fixed to a large capacitance.

The nonvolatile memory 70 in FIG. 2 stores setting information on voltage selection of the switch circuit 36. The setting information on voltage selection is information for setting which voltage is output as the first output voltage VQ1 and which voltage is output as the second output voltage VQ2 from the plurality of voltages including the first input voltage VI1 and the second input voltage VI2 by the switch circuit 36. Specifically, the logic circuit 60 reads the setting information on voltage selection from the nonvolatile memory 70, and outputs a switch control signal to the switch circuit 36 based on the setting information on voltage selection. The on and off control of the plurality of switch elements in the switch circuit 36 is performed based on the switch control signal from the logic circuit 60, whereby the switch circuit 36 outputs, from the first output terminal TQ1, the first output voltage VQ1 selected from among the plurality of voltages including the first input voltage VI1 and the second input voltage VI2, and outputs, from the second output terminal TQ2, the second output voltage VQ2 selected from among the plurality of voltages. In this way, the voltage selected by the switch circuit 36 can be output as the first output voltage VQ1 from the first output terminal TQ1 or can be output as the second output voltage VQ2 from the second output terminal TQ2, based on the setting information on voltage selection stored in the nonvolatile memory 70 that can store information even without power supply. The setting information on voltage selection of the switch circuit 36 may be stored using, for example, a fuse circuit. Alternatively, the voltage selection of the switch circuit 36 may be set by, for example, changing a mask of a metal wiring or the like.

2. Switch Circuit

Figure 5:
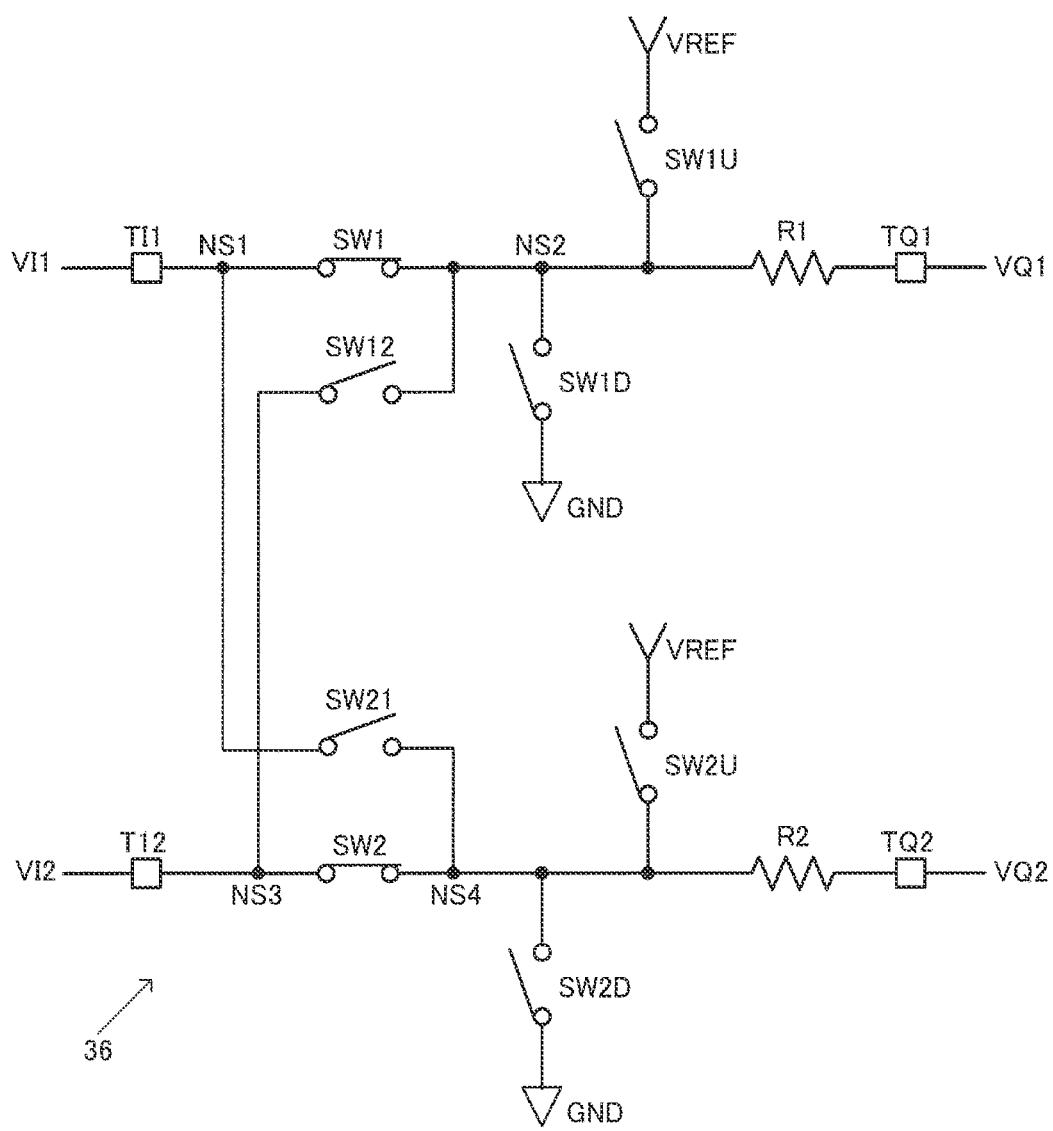
FIG. 5 is a diagram illustrating a configuration example of a switch circuit.

FIG. 5 is a diagram illustrating a configuration example of the switch circuit 36. As illustrated in FIG. 5, the switch circuit 36 receives the first input voltage VI1 at the first input terminal TI1, receives the second input voltage VI2 at the second input terminal TI2, outputs the first output voltage VQ1 to the first output terminal TQ1, and outputs the second output voltage VQ2 to the second output terminal TQ2. In FIG. 5, the switch circuit 36 includes switch elements SW1, SW1D, SW1U, SW12, SW2, SW2D, SW2U, and SW21. The switch circuit 36 includes resistors R1 and R2 provided correspondingly to the first output terminal TQ1 and the second output terminal TQ2.

The switch element SW1 is provided between a node NS1, which is coupled to the first input terminal TI1, and a node NS2. The pull-down switch element SW1D is provided between a GND supply node and the node NS2. The pull-up switch element SW1U is provided between a VREF supply node and the node NS2. The switch element SW12 is provided between the node NS2 and a node NS3 that is coupled to the second input terminal TI2. The resistor R1 is provided between the node NS2 and the first output terminal TQ1.

The switch element SW2 is provided between the node NS3, which is coupled to the second input terminal TI2, and a node NS4. The pull-down switch element SW2D is provided between a GND supply node and the node NS4. The pull-up switch element SW2U is provided between a VREF supply node and the node NS4. The switch element SW21 is provided between the node NS4 and the node NS1. The resistor R2 is provided between the node NS4 and the second output terminal TQ2.

In the switch circuit 36 in FIG. 5, when the switch element SW1 is turned on, the first input voltage VI1 is output as the first output voltage VQ1. When the switch element SW2 is turned on, the second input voltage VI2 is output as the second output voltage VQ2. On the other hand, when the switch element SW12 is turned on, the second input voltage VI2 is output as the first output voltage VQ1. When the switch element SW21 is turned on, the first input voltage VI1 is output as the second output voltage VQ2. When the switch element SW1D is turned on, the first output voltage VQ1 is set to the fixed voltage GND, and when the switch element SW1U is turned on, the first output voltage VQ1 is set to the fixed voltage VREF. When the switch element SW2D is turned on, the second output voltage VQ2 is set to the fixed voltage GND, and when the switch element SW2U is turned on, the second output voltage VQ2 is set to the fixed voltage VREF. Here, GND is a low potential side fixed voltage, and VREF is a high potential side fixed voltage.

FIG. 6 is a table illustrating setting of operation modes of the switch circuit 36 in FIG. 5. In FIG. 6, indicates an on state for each of the switch elements of SW1, SW1D, SW1U, SW12, SW2, SW2D, SW2U, and SW21, and "0" indicates an off state for each of the switch elements. In FIG. 5, it is assumed that the temperature compensation voltage VCP is input as the first input voltage VI1, and the frequency control voltage VFC is input as the second input voltage VI2 as illustrated in FIG. 2.

As illustrated in FIG. 6, when the switch elements SW1 and SW2 are turned on, the temperature compensation voltage VCP and the frequency control voltage VFC are output as the first output voltage VQ1 and the second output voltage VQ2, respectively. Accordingly, a VC-TCXO mode is set in which the first variable capacitance circuit 31 is for temperature compensation, and the second variable capacitance circuit 32 is for frequency control. Accordingly, it is possible to implement VC-TCXO in which temperature compensation by using the temperature compensation voltage VCP and frequency control by using the frequency control voltage VFC are performed.

On the other hand, when the switch element SW1 is turned on and the switch element SW2D or SW2U is turned on, a TCXO mode is set in which the temperature compensation voltage VCP is output as the first output voltage VQ1 to the first variable capacitance circuit 31 having a positive characteristic and GND or VREF that is a fixed voltage is output as the second output voltage VQ2 to the second variable capacitance circuit 32. The second variable capacitance circuit 32 having a negative characteristic is fixed to a high load capacitance CL when GND is input as the second output voltage VQ2, and is fixed to a low load capacitance CL when VREF is input as the second output voltage VQ2. Accordingly, it is possible to implement TCXO in which frequency control by using the frequency control voltage VFC is not performed but temperature compensation by using the temperature compensation voltage VCP is performed.

When the switch element SW2 is turned on and the switch element SW1D or SW1U is turned on, a VCXO mode is set in which the frequency control voltage VFC is output as the second output voltage VQ2 to the second variable capacitance circuit 32 having a negative characteristic and the fixed voltage GND or VREF is output as the first output voltage VQ1 to the first variable capacitance circuit 31. The first variable capacitance circuit 31 having a positive characteristic is fixed to the low load capacitance CL when GND is input as the first output voltage VQ1, and is fixed to the high load capacitance CL when VREF is input as the first output voltage VQ1. Accordingly, it is possible to implement VCXO in which the temperature compensation by using the temperature compensation voltage VCP is not performed but the frequency control by using the frequency control voltage VFC is performed.

When the switch element SW1D or SW1U is turned on and the switch element SW2D or SW2U is turned on, an SPXO mode is set in which GND or VREF, which is a fixed voltage, is output as the first output voltage VQ1 to the first variable capacitance circuit 31 and GND or VREF is output as the second output voltage VQ2 to the second variable capacitance circuit 32. When GND and VREF are input, the first variable capacitance circuit 31 having a positive characteristic is fixed to the low load capacitance CL and the high load capacitance CL, respectively. When GND and VREF are input, the second variable capacitance circuit 32 having a negative characteristic is fixed to the high load capacitance CL and the low load capacitance CL, respectively. Accordingly, it is possible to implement SPXO in which the load capacitances CL of both the first variable capacitance circuit 31 and the second variable capacitance circuit 32 are fixed, and the temperature compensation by using the temperature compensation voltage VCP and the frequency control by using the frequency control voltage VFC are not performed.

When the switch element SW21 is turned on and the switch element SW1D or SW1U is turned on, an inverted TCXO mode is set in which the temperature compensation voltage VCP is output as the second output voltage VQ2 to the second variable capacitance circuit 32 having a negative characteristic and GND or VREF is output as the first output voltage VQ1 to the first variable capacitance circuit 31.

When GND and VREF are input, the first variable capacitance circuit 31 having a positive characteristic is fixed to the low load capacitance CL and the high load capacitance CL, respectively. In this way, when the temperature compensation voltage VCP is output to the second variable capacitance circuit 32 having a negative characteristic, the temperature compensation by using the temperature compensation voltage VCP can be performed with a characteristic of polarity opposite to that of the normal TCXO, and the inverted TCXO in which inverted temperature compensation is performed can be implemented. For example, when the frequency-temperature characteristic of the resonator 10 is a characteristic having polarity opposite to that in FIG. 17 to be described later, the inverted TCXO mode is useful.

When the switch element SW12 is turned on and the switch element SW2D or SW2U is turned on, an inverted VCXO mode is set in which the frequency control voltage VFC is output as the first output voltage VQ1 to the first variable capacitance circuit 31 having a positive characteristic and GND or VREF is output as the second output voltage VQ2 to the second variable capacitance circuit 32. When GND and VREF are input, the second variable capacitance circuit 32 having a negative characteristic is fixed to the high load capacitance CL and the low load capacitance CL, respectively. Accordingly, it is possible to perform the frequency control by using the frequency control voltage VFC with a characteristic of polarity opposite to that of the normal VCXO, and it is possible to implement the inverted VCXO in which inverted frequency control is performed. In the inverted VCXO, when the frequency control voltage VFC increases due to an increase in the control voltage VC or the like from the outside, the capacitance of the first variable capacitance circuit 31 having a positive characteristic, to which the frequency control voltage VFC is input, increases and the oscillation frequency decreases, and when the frequency control voltage VFC decreases, the capacitance of the first variable capacitance circuit 31 decreases and the oscillation frequency increases. Therefore, the inverted VCXO, in which the oscillation frequency decreases when the frequency control voltage VFC increases and the oscillation frequency increases when the frequency control voltage VFC decreases, can be implemented without providing an inverting amplifier or the like in the frequency control circuit 50. As a result, it is possible to implement the inverted VCXO while achieving a reduction in circuit scale and a reduction in power consumption.

When the switch element SW12 is turned on and the switch element SW21 is turned on, an inverted VC-inverted TCXO mode is set in which the frequency control voltage VFC is output as the first output voltage VQ1 to the first variable capacitance circuit 31 having a positive characteristic and the temperature compensation voltage VCP is output as the second output voltage VQ2 to the second variable capacitance circuit 32 having a negative characteristic. In the inverted VC-inverted TCXO, when the frequency control voltage VFC increases due to an increase in the control voltage VC or the like, the capacitance of the first variable capacitance circuit 31 to which the frequency control voltage VFC is input increases and the oscillation frequency decreases, and when the control voltage VC decreases, the capacitance of the first variable capacitance circuit 31 to which the frequency control voltage VFC is input decreases and the oscillation frequency increases, and the inverted VCXO is implemented. Further, since the temperature compensation voltage VCP is output to the second variable capacitance circuit 32 having a negative characteristic, the temperature compensation by using the temperature compensation voltage VCP can be performed with a characteristic of polarity opposite to that of the normal TCXO, and the inverted TCXO in which the inverted temperature compensation is performed is implemented. Therefore, it is possible to implement the inverted VC-inverted TCXO that is an inverted VCXO and an inverted TCXO.

As described above, the circuit device 20 according to the present embodiment includes the temperature compensation circuit 40 that outputs, based on a temperature detection result of the temperature sensor 48, the temperature compensation voltage VCP for temperature compensating the oscillation frequency of the oscillation circuit 30, and the frequency control circuit 50 that outputs the frequency control voltage VFC for the oscillation frequency. In a first mode, the switch circuit 36 outputs the temperature compensation voltage VCP to the first output terminal TQ1, and outputs the frequency control voltage VFC to the second output terminal TQ2. The first mode corresponds to, for example, the VC-TCXO mode in FIG. 6. In this way, by setting the operation mode of the circuit device 20 to the first mode, the temperature compensation voltage VCP from the temperature compensation circuit 40 is supplied to the first variable capacitance circuit 31 having a positive characteristic, and the frequency control voltage VFC from the frequency control circuit 50 is supplied to the second variable capacitance circuit 32 having a negative characteristic. Therefore, the temperature compensation by using the temperature compensation voltage VCP is performed, and when the frequency control voltage VFC increases, the capacitance of the second variable capacitance circuit 32 having a negative characteristic decreases, whereby the oscillation frequency increases, and when the frequency control voltage VFC decreases, the capacitance of the second variable capacitance circuit 32 increases, whereby the oscillation frequency decreases. Therefore, it is possible to provide the circuit device 20 for VC-TCXO in which both the temperature compensation by using the temperature compensation voltage VCP and the frequency control by using the frequency control voltage VFC are possible.

In a second mode, the switch circuit 36 outputs the temperature compensation voltage VCP to the first output terminal TQ1, and outputs a first fixed voltage to the second output terminal TQ2. The second mode corresponds to, for example, the TCXO mode in FIG. 6. The first fixed voltage is, for example, a low potential side voltage such as the ground voltage GND or a high potential side voltage such as the reference voltage VREF. In this way, by setting the operation mode of the circuit device 20 to the second mode, the temperature compensation voltage VCP from the temperature compensation circuit 40 is supplied to the first variable capacitance circuit 31 having a positive characteristic, and the first fixed voltage is supplied as a capacitance control voltage to the second variable capacitance circuit 32. Therefore, the temperature compensation is performed according to a capacitance change of the first variable capacitance circuit 31 based on the temperature compensation voltage VCP, and the capacitance of the second variable capacitance circuit 32 is fixed. Therefore, it is possible to provide the circuit device 20 for TCXO in which the frequency control by using the frequency control voltage VFC is not performed but the temperature compensation by using the temperature compensation voltage VCP is performed.

In a third mode, the switch circuit 36 outputs a second fixed voltage to the first output terminal TQ1, and outputs the frequency control voltage VFC to the second output terminal TQ2. The third mode corresponds to, for example, the VCXO mode in FIG. 6. The second fixed voltage is, for example, a low potential side voltage such as GND or a high potential side voltage such as VREF. In this way, by setting the operation mode of the circuit device 20 to the third mode, the frequency control voltage VFC from the frequency control circuit 50 is supplied to the second variable capacitance circuit 32 having a negative characteristic, and the second fixed voltage is supplied as a capacitance control voltage to the first variable capacitance circuit 31. Therefore, the frequency control is performed according to the capacitance change of the second variable capacitance circuit 32 based on the frequency control voltage VFC, and the capacitance of the first variable capacitance circuit 31 is fixed. Therefore, it is possible to provide the circuit device 20 for VCXO in which the temperature compensation by using the temperature compensation voltage VCP is not performed but the frequency control by using the frequency control voltage VFC is performed.

In a fourth mode, the switch circuit 36 outputs a third fixed voltage to the first output terminal TQ1 and outputs a fourth fixed voltage to the second output terminal TQ2. The fourth mode corresponds to, for example, the SPXO mode in FIG. 6. The third fixed voltage and the fourth fixed voltage are, for example, a low potential side voltage such as GND or a high potential side voltage such as VREF. In this way, by setting the operation mode of the circuit device 20 to the fourth mode, the third fixed voltage is supplied as a capacitance control voltage to the first variable capacitance circuit 31, and the fourth fixed voltage is supplied as a capacitance control voltage to the second variable capacitance circuit 32. Therefore, the capacitance of the first variable capacitance circuit 31 and the capacitance of the second variable capacitance circuit 32 are fixed, and it is possible to provide the circuit device 20 for SPXO in which the temperature compensation and the frequency control based on the frequency control voltage VFC are not performed.

In a fifth mode, the switch circuit 36 outputs the frequency control voltage VFC to the first output terminal TQ1, and outputs a fifth fixed voltage or the temperature compensation voltage VCP to the second output terminal TQ2. The fifth mode corresponds to, for example, the inverted VCXO mode or the inverted VC-inverted TCXO mode in FIG. 6. The fifth fixed voltage is, for example, a low potential side voltage such as GND or a high potential side voltage such as VREF. In this way, by setting the operation mode of the circuit device 20 to the fifth mode, the frequency control voltage VFC from the frequency control circuit 50 is supplied to the first variable capacitance circuit 31 having a positive characteristic, and the fifth fixed voltage or the temperature compensation voltage VCP is supplied to the second variable capacitance circuit 32 having a negative characteristic. Therefore, when the frequency control voltage VFC increases, the capacitance of the first variable capacitance circuit 31 having a positive characteristic increases, whereby the oscillation frequency decreases, and when the frequency control voltage VFC decreases, the capacitance of the first variable capacitance circuit 31 decreases, whereby the oscillation frequency increases. On the other hand, the capacitance of the second variable capacitance circuit 32 is fixed due to being supplied with the fifth fixed voltage, or frequency adjustment for temperature compensation based on the temperature compensation voltage VCP is performed. In this way, the inverted VCXO or the like, in which the oscillation frequency decreases when the frequency control voltage VFC increases and the oscillation frequency increases when the frequency control voltage VFC decreases, can be implemented without providing an inverting amplifier, for example.

Figure 7:
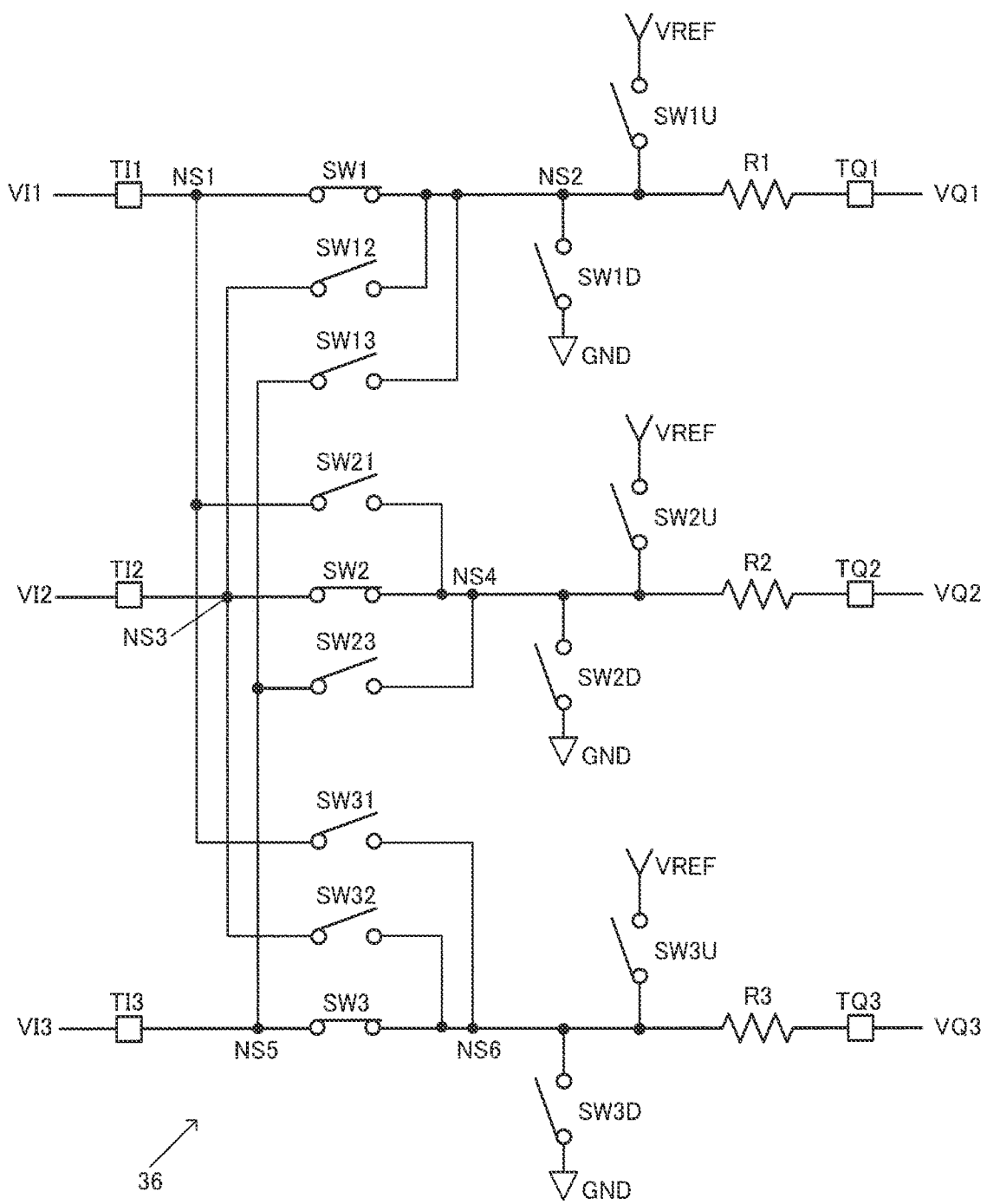
FIG. 7 is a diagram illustrating another configuration example of the switch circuit.

The configuration of the switch circuit 36 is not limited to the configuration illustrated in FIG. 5, and various modifications can be made. For example, the switch circuit 36 may be a circuit that cannot set the first output voltage VQ1 or the second output voltage VQ2 to a fixed voltage such as VREF and GND. For example, the switch circuit 36 may have a configuration as illustrated in FIG. 7. In FIG. 7, a third input terminal TI3 is further provided in addition to the first input terminal TI1 and the second input terminal TI2, and a third output terminal TQ3 is further provided in addition to the first output terminal TQ1 and the second output terminal TQ2. In FIG. 7, in the switch circuit 36, the first input voltage VI1 is input to the first input terminal TI1, the second input voltage VI2 is input to the second input terminal TI2, and a third input voltage VI3 is input to the third input terminal TI3. The switch circuit 36 outputs, to the first output terminal TQ1, the first output voltage VQ1 selected from a plurality of voltages including the first input voltage VI1, the second input voltage VI2, and the third input voltage VI3, outputs, to the second output terminal TQ2, the second output voltage VQ2 selected from the plurality of voltages, and outputs, to the third output terminal TQ3, the third output voltage VQ3 selected from the plurality of voltages. The switch circuit 36 is further provided with switch elements SW3, SW3D, SW3U, SW31, and SW32 in order to enable the input of the third input voltage VI3 and the output of the third output voltage VQ3. In this way, in the switch circuit 36, the number of input terminals may be three or more, and the number of output terminals may also be three or more.

In addition, the circuit device 20 according to the present embodiment does not need to have all the operation modes of the first mode to the fifth mode described above, and may have, for example, at least two operation modes among the first mode to the fifth mode. For example, in the circuit device 20 according to the present embodiment, it is not always necessary to provide both the temperature compensation circuit 40 and the frequency control circuit 50, and a modification in which only one of the temperature compensation circuit 40 and the frequency control circuit 50 is provided can be made.

Figure 8:
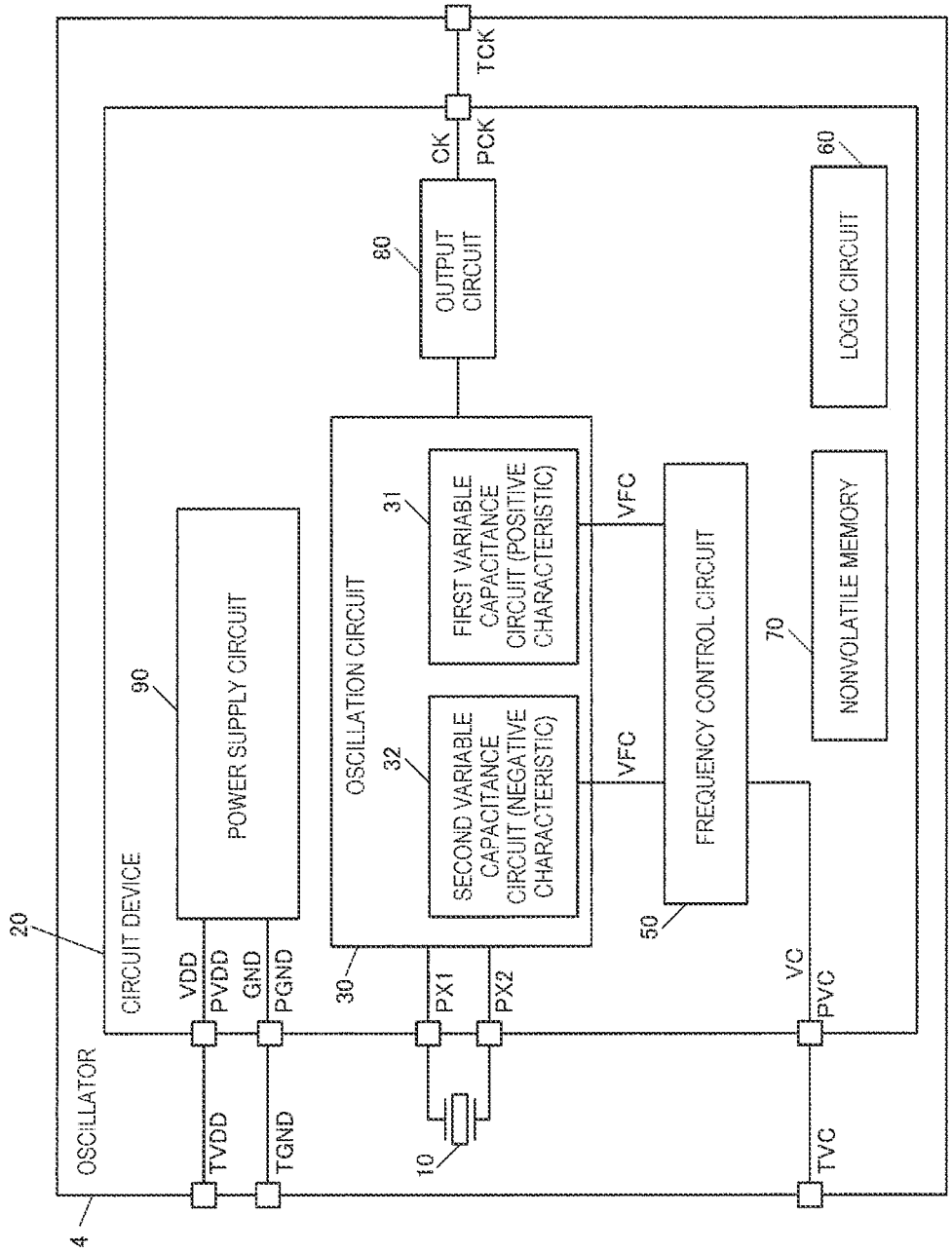
FIG. 8 is a diagram illustrating another detailed configuration example of the circuit device and the oscillator according to the present embodiment.

For example, FIG. 8 is a diagram illustrating another detailed configuration example of the circuit device 20 and the oscillator 4 according to the present embodiment. In FIG. 8, the frequency control circuit 50 is provided, but the temperature compensation circuit 40 is not provided. The oscillation circuit 30 includes the first variable capacitance circuit 31 having a positive characteristic and the second variable capacitance circuit 32 having a negative characteristic, and in a first mode, the frequency control voltage VFC is input as a capacitance control voltage to the second variable capacitance circuit 32, and in a second mode, the frequency control voltage VFC is input as a capacitance control voltage to the first variable capacitance circuit 31.

In this way, if the operation mode of the circuit device 20 is set to the first mode, when the frequency control voltage VFC increases, the capacitance of the second variable capacitance circuit 32 having a negative characteristic to which the frequency control voltage VFC is input decreases, whereby the oscillation frequency increases, and when the frequency control voltage VFC decreases, the capacitance of the second variable capacitance circuit 32 increases, whereby the oscillation frequency decreases. Therefore, by setting the operation mode of the circuit device 20 to the first mode, it is possible to implement a normal VCXO in which the oscillation frequency increases when the frequency control voltage VFC increases and the oscillation frequency decreases when the frequency control voltage VFC decreases.

Further, if the operation mode of the circuit device 20 is set to the second mode, when the frequency control voltage VFC increases, the capacitance of the first variable capacitance circuit 31 having a positive characteristic to which the frequency control voltage VFC is input increases, whereby the oscillation frequency decreases, and when the frequency control voltage VFC decreases, the capacitance of the first variable capacitance circuit 31 decreases, whereby the oscillation frequency increases. Therefore, by setting the operation mode of the circuit device 20 to the second mode, the inverted VCXO or the like, in which the oscillation frequency decreases when the frequency control voltage VFC increases and the oscillation frequency increases when the frequency control voltage VFC decreases, can be implemented without providing an inverting amplifier or the like in the frequency control circuit 50. In FIG. 8, for example, in the first mode, the switch circuit 36 (not illustrated) may output the frequency control voltage VFC input from the frequency control circuit 50 to the second variable capacitance circuit 32 via the second output terminal TQ2, and in the second mode, the switch circuit 36 may output the frequency control voltage VFC input from the frequency control circuit 50 to the first variable capacitance circuit 31 via the first output terminal TQ1.

As described above, according to the present embodiment, by providing the switch circuit 36, the circuit device 20 can be operated in various operation modes. For example, various operation modes such as VC-TCXO, TCXO, VCXO, SPXO, inverted VCXO, and inverted TCXO can be implemented by the circuit device 20 of a platform having a common design. In this way, it is not necessary to separately design the circuit device 20 dedicated to each of the plurality of operation modes. For example, the circuit device 20 of the same common platform can be operated in a desired operation mode by storing setting information on voltage selection in the nonvolatile memory 70, setting a fuse by a fuse circuit, or switching a mask layer of a metal layer or the like. Accordingly, it is possible to provide the circuit device 20 and the oscillator 4 having various operation modes while reducing the development period and the development cost of the circuit device 20 and the oscillator 4.

3. Oscillation Circuit

Figure 9:
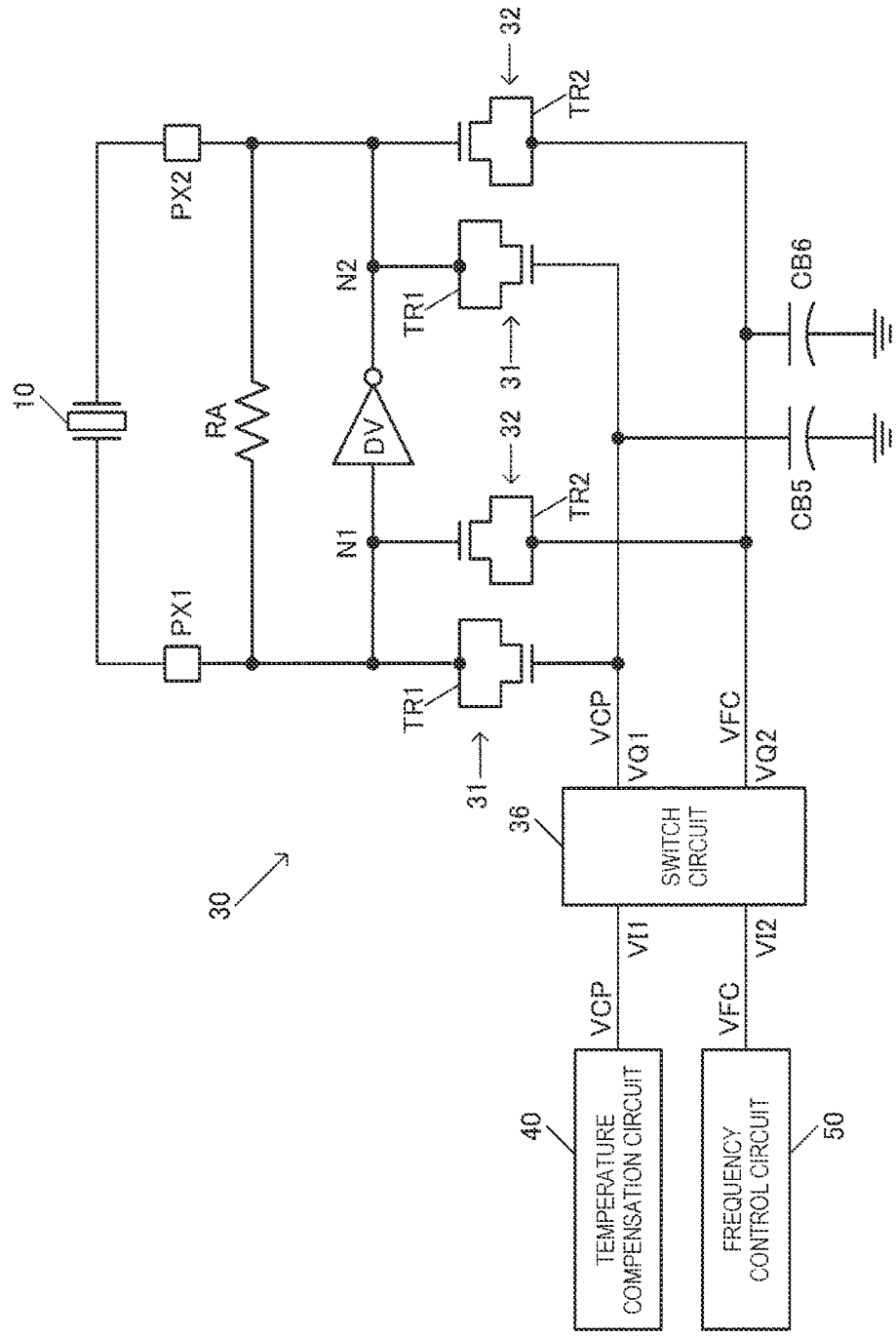
FIG. 9 is a diagram illustrating a first configuration example of an oscillation circuit.

Next, the oscillation circuit 30 will be described in detail. FIG. 9 is a diagram illustrating a first configuration example of the oscillation circuit 30.

Hereinafter, a case where the operation mode of the circuit device 20 is set to a first mode, which is the VC-TCXO mode in FIG. 6, will be mainly described as an example. In the first mode, as illustrated in FIG. 9, the temperature compensation voltage VCP from the temperature compensation circuit 40 and the frequency control voltage VFC from the frequency control circuit 50 are respectively input as the first input voltage VI1 and the second input voltage VI2 to the switch circuit 36. The switch circuit 36 outputs, as the first output voltage VQ1 and the second output voltage VQ2, the temperature compensation voltage VCP and the frequency control voltage VFC to the first variable capacitance circuit 31 and the second variable capacitance circuit 32, respectively.

The oscillation circuit 30 in FIG. 9 includes a drive circuit DV, a resistor RA, the first variable capacitance circuit 31, and the second variable capacitance circuit 32. The oscillation circuit 30 can include a capacitor CB5 provided between a supply node of the temperature compensation voltage VCP and a low potential side power supply node, and a capacitor CB6 provided between a supply node of the frequency control voltage VFC and a low potential side power supply node. The low potential side power supply node is, for example, a ground node. One end of the resonator 10 is coupled to a node N1, which is an input node of the drive circuit DV, via the pad PX1, and the other end of the resonator 10 is coupled to a node N2, which is an output node of the drive circuit DV, via the pad PX2. The resistor RA serving as a feedback element from the output to the input of the drive circuit DV has one end coupled to the node N1 and the other end coupled to the node N2. In FIG. 9, the first variable capacitance circuit 31 and the second variable capacitance circuit 32 are provided at both the node N1 to which one end of the resonator 10 is coupled via the pad PX1 and the node N2 to which the other end of the resonator 10 is coupled via the pad PX2. However, the first variable capacitance circuit 31 and the second variable capacitance circuit 32 may be provided only at one of the nodes N1 and N2.

In FIG. 9, the first variable capacitance circuit 31 is implemented by a transistor TR1, and the second variable capacitance circuit 32 is implemented by a transistor TR2. The transistors TR1 and TR2 are variable capacitance elements of a metal oxide semiconductor (MOS) type, and are also referred to as MOS varactors. In FIG. 9, the first variable capacitance circuit 31 and the second variable capacitance circuit 32 are implemented by N-type transistors TR1 and TR2, respectively. The MOS type variable capacitance element is a capacitance element, in which a source and a drain of a MOS transistor are short-circuited and an electrostatic capacitance generated between the short-circuited source and drain and a gate is variably controlled by using a capacitance control voltage.

Although a case where each of the first variable capacitance circuit 31 and the second variable capacitance circuit 32 is implemented by one transistor that is a MOS type variable capacitance element will be mainly described as an example hereinafter, each of the first variable capacitance circuit 31 and the second variable capacitance circuit 32 may be implemented by two or more transistors provided in parallel. In addition, a modification in which a P-type transistor is used as a transistor constituting the first variable capacitance circuit 31 and the second variable capacitance circuit 32 can be made. Hereinafter, configurations of the first variable capacitance circuit 31 and the second variable capacitance circuit 32 provided at the node N1 will be mainly described as an example. Since configurations of the first variable capacitance circuit 31 and the second variable capacitance circuit 32 coupled to the node N2 are similar to those provided at the node N1, a detailed description thereof will be omitted.

In the transistor TR1 of the first variable capacitance circuit 31 on the node N1 side, the gate thereof is supplied with the temperature compensation voltage VCP from the temperature compensation circuit 40, and the source and the drain thereof are coupled to the node N1. Accordingly, a variable capacitance circuit having a positive voltage capacitance characteristic as illustrated in FIG. 3 is implemented. When the temperature compensation voltage VCP increases, a load capacitance of the node N1 increases, and when the temperature compensation voltage VCP decreases, the load capacitance of the node N1 decreases. Therefore, when the temperature compensation voltage VCP increases, the oscillation frequency decreases, and when the temperature compensation voltage VCP decreases, the oscillation frequency increases. As a result, with respect to a cubic frequency-temperature characteristic of the resonator 10 illustrated in FIG. 17 to be described later, the temperature compensation voltage VCP illustrated in FIG. 19 to be described later cancels the increase and decrease of the oscillation frequency, and thus the temperature compensation for making the oscillation frequency constant can be implemented.

In the transistor TR2 of the second variable capacitance circuit 32 on the node N1 side, the source and the drain thereof are supplied with the frequency control voltage VFC from the frequency control circuit 50, and the gate thereof is coupled to the node N1. Accordingly, a variable capacitance circuit having a negative voltage capacitance characteristic as illustrated in FIG. 4 is implemented. When the frequency control voltage VFC increases, the load capacitance of the node N1 decreases, and when the frequency control voltage VFC decreases, the load capacitance of the node N1 increases. Therefore, when the frequency control voltage VFC increases, the oscillation frequency increases, and when the frequency control voltage VFC decreases, the oscillation frequency decreases. Therefore, it is possible to implement VC-TCXO that is a voltage-controlled temperature compensation oscillator configured to control the oscillation frequency of the oscillation circuit 30 based on the control voltage VC from the outside.

Figure 10:
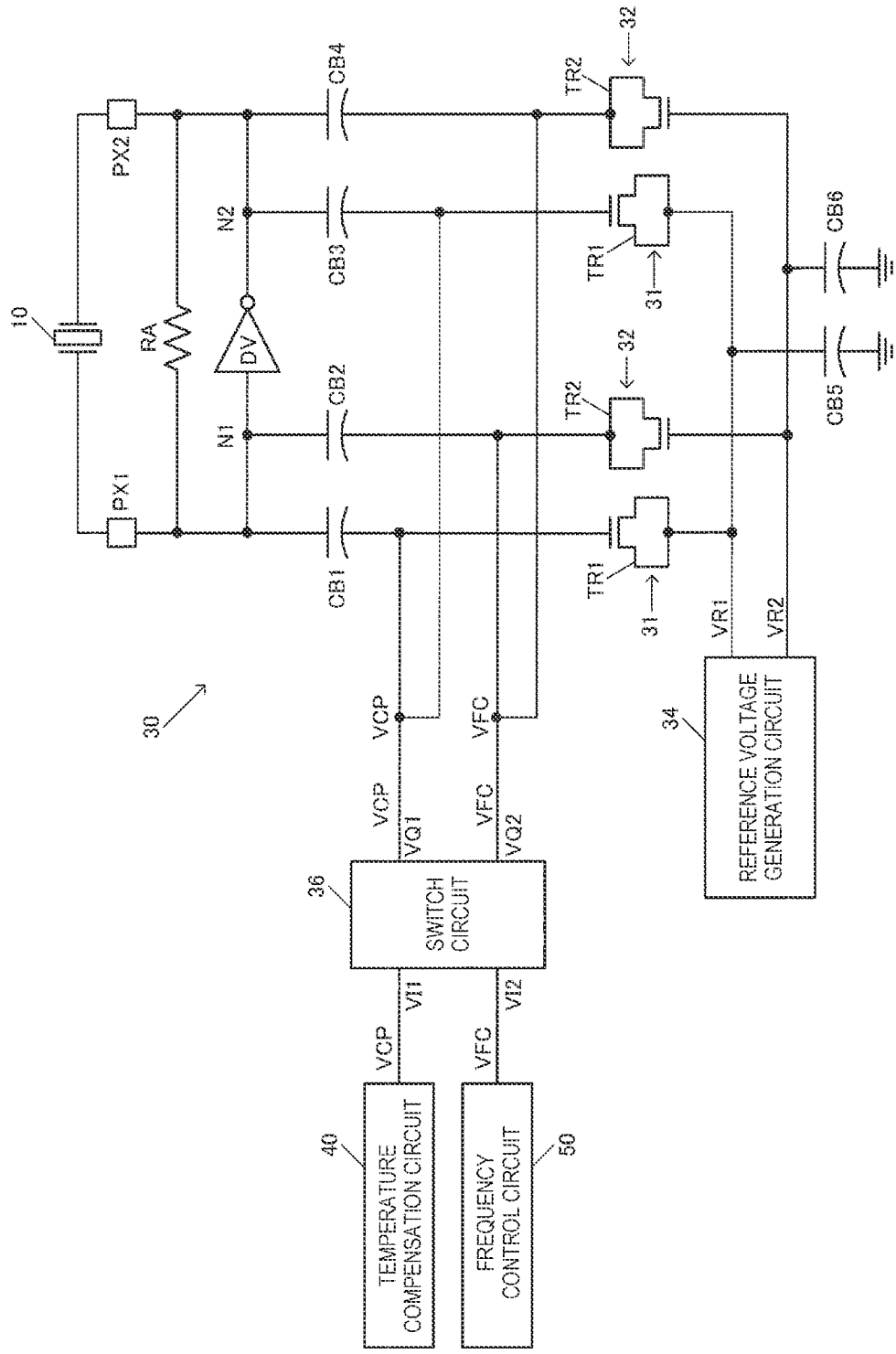
FIG. 10 is a diagram illustrating a second configuration example of the oscillation circuit.

FIG. 10 is a diagram illustrating a second configuration example of the oscillation circuit 30. The oscillation circuit 30 is not limited to the configurations in FIGS. 9 and 10, and various modifications such as omitting some of the components, adding other components, and replacing some of the components with other components can be made.

In the second configuration example in FIG. 10, the first variable capacitance circuit 31 on the node N1 side is implemented by the transistor TR1, and the second variable capacitance circuit 32 on the node N1 side is implemented by the transistor TR2. The first variable capacitance circuit 31 is electrically coupled to the node N1 via a capacitor CB1 for DC cut, and the second variable capacitance circuit 32 is electrically coupled to the node N1 via a capacitor CB2 for DC cut. In FIG. 10, a reference voltage generation circuit 34 that generates reference voltages VR1 and VR2 is provided. The first variable capacitance circuit 31 and the second variable capacitance circuit 32 on the node N2 side are coupled to the node N2 via capacitors CB3 and CB4, respectively, and configurations thereof are the same as those of the first variable capacitance circuit 31 and the second variable capacitance circuit 32 on the node N1 side, and thus a detailed description thereof will be omitted.

The transistor TR1, which is a first variable capacitance element, and the capacitor CB1 are provided in series between a supply node of the reference voltage VR1 and the node N1. Specifically, one end of the capacitor CB1 is coupled to the node N1, the other end of the capacitor CB1 is coupled to the gate of the transistor TR1, and the reference voltage VR1 is supplied to the source and the drain of the transistor TR1. The temperature compensation circuit 40 supplies the temperature compensation voltage VCP to a coupling node between the capacitor CB1 and the transistor TR1 via the switch circuit 36.

The transistor TR2, which is a second variable capacitance element, and the capacitor CB2 are provided in series between a supply node of the reference voltage VR2 and the node N1. Specifically, one end of the capacitor CB2 is coupled to the node N1, the other end of the capacitor CB2 is coupled to the source and the drain of the transistor TR2, and the reference voltage VR2 is supplied to the gate of the transistor TR2. The frequency control circuit 50 supplies the frequency control voltage VFC to a coupling node between the capacitor CB2 and the transistor TR2 via the switch circuit 36.

In FIG. 10, the first variable capacitance circuit 31 may be implemented by a plurality of transistors TR1 provided in parallel, and the second variable capacitance circuit 32 may be implemented by a plurality of transistors TR2 provided in parallel. In this case, a plurality of reference voltages VR1 different from one another may be supplied to the sources and drains of the plurality of transistors TR1 constituting the first variable capacitance circuit 31. A plurality of reference voltages VR2 different from one another may be supplied to the gates of the plurality of transistors TR2 constituting the second variable capacitance circuit 32. In this way, a linearity characteristic of a total capacitance of the first variable capacitance circuit 31 can be improved by overlapping different voltage capacitance characteristics of the plurality of transistors TR1. In addition, a linearity characteristic of a total capacitance of the second variable capacitance circuit 32 can be improved by overlapping different voltage capacitance characteristics of the plurality of transistors TR2.

Figure 11:
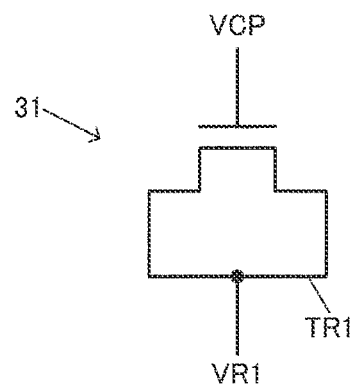
FIG. 11 is a diagram illustrating the first variable capacitance circuit.
Figure 12:
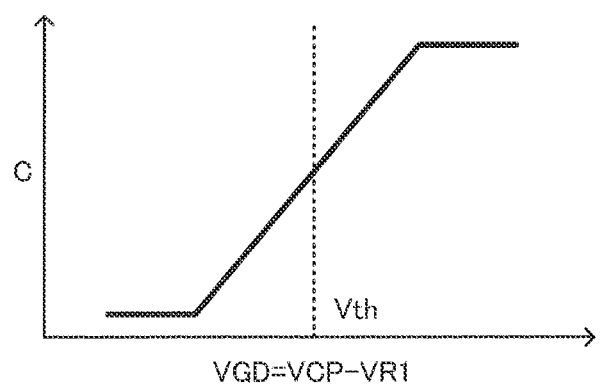
FIG. 12 is a graph illustrating a voltage capacitance characteristic of the first variable capacitance circuit.
Figure 13:
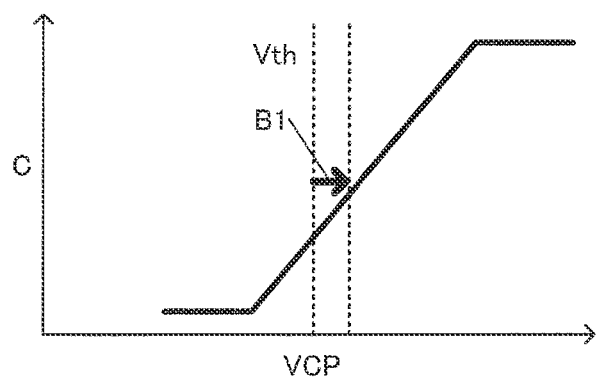
FIG. 13 is another graph illustrating the voltage capacitance characteristic of the first variable capacitance circuit.

As illustrated in FIG. 11, in the transistor TR1 constituting the first variable capacitance circuit 31, the temperature compensation voltage VCP is supplied to the gate, and the reference voltage VR1 is supplied to the source and the drain. Accordingly, as illustrated in FIG. 12, a voltage capacitance characteristic of the first variable capacitance circuit 31 is a positive voltage capacitance characteristic with respect to VGD=VCP−VR1, which is a gate-drain voltage. Therefore, as illustrated in FIG. 13, the voltage capacitance characteristic of the first variable capacitance circuit 31 is also a positive voltage capacitance characteristic with respect to the temperature compensation voltage VCP. Specifically, in FIG. 13, the positive voltage capacitance characteristic is shifted by the reference voltage VR1 as indicated by B1 with respect to that in FIG. 12.

In FIGS. 12 and 13, Vth is a threshold voltage of the transistor TR1. As described above, the inclination of the voltage capacitance characteristic is maximum in the vicinity of the center of the change range, and in FIG. 12, the inclination of the voltage capacitance characteristic is maximum when VGD=Vth. On the other hand, in FIG. 13, the inclination of the voltage capacitance characteristic is maximum when VCP=Vth+VR1.

Figure 14:
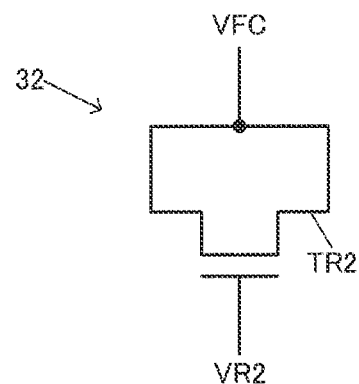
FIG. 14 is a diagram illustrating the second variable capacitance circuit.
Figure 15:
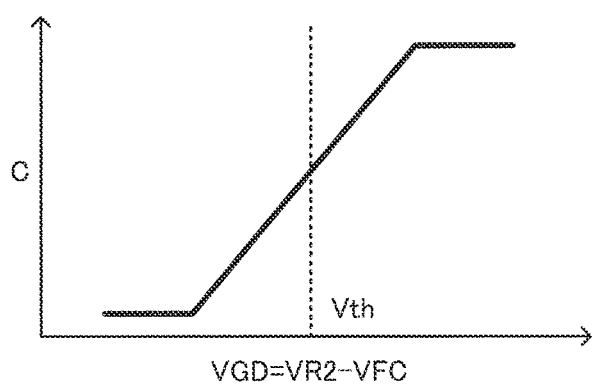
FIG. 15 is a graph illustrating a voltage capacitance characteristic of the second variable capacitance circuit.
Figure 16:
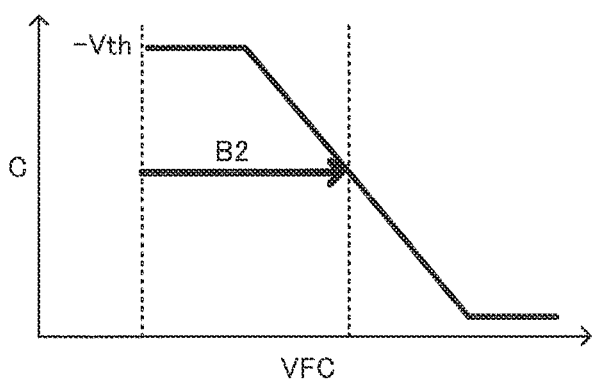
FIG. 16 is another graph illustrating the voltage capacitance characteristic of the second variable capacitance circuit.

As illustrated in FIG. 14, in the transistor TR2 constituting the second variable capacitance circuit 32, the frequency control voltage VFC is supplied to the source and the drain, and the reference voltage VR2 is supplied to the gate. Accordingly, as illustrated in FIG. 15, a voltage capacitance characteristic of the second variable capacitance circuit 32 is a positive voltage capacitance characteristic with respect to VGD=VR2−VFC, which is a gate-drain voltage. In FIG. 15, Vth is a threshold voltage of the transistor TR2. Therefore, as illustrated in FIG. 16, the voltage capacitance characteristic of the second variable capacitance circuit 32 is a negative voltage capacitance characteristic with respect to the frequency control voltage VFC. Specifically, in FIG. 16, the negative voltage capacitance characteristic has inverted polarity and is shifted by the reference voltage VR2 as indicated by B2 with respect to that in FIG. 15.

Figure 17:
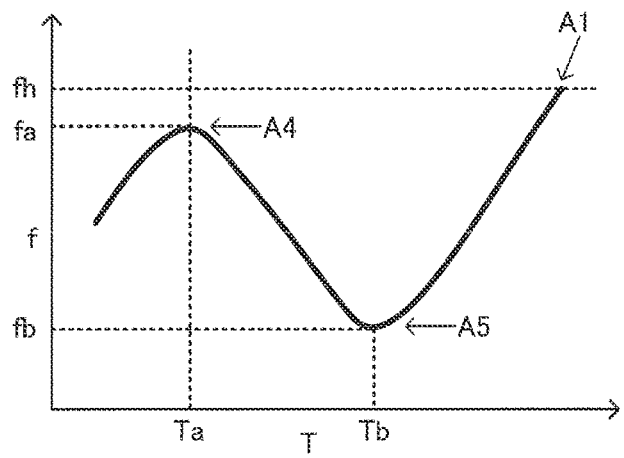
FIG. 17 is a graph illustrating an example of a frequency-temperature characteristic of a resonator.
Figure 18:
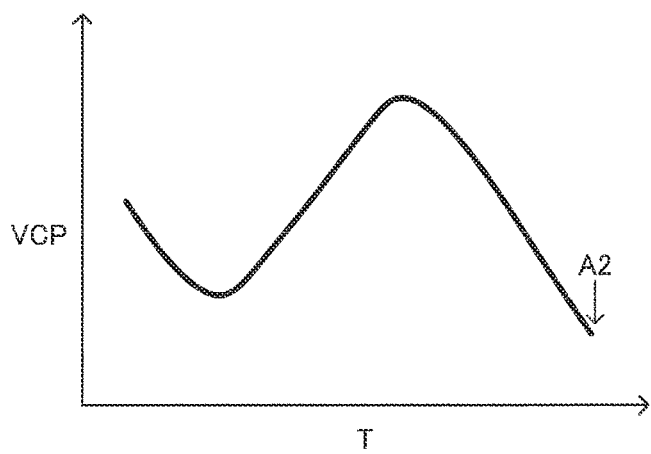
FIG. 18 is a graph illustrating an example of a temperature characteristic of a temperature compensation voltage in a case where the second variable capacitance circuit having a negative characteristic is used.

FIG. 17 is a graph illustrating a frequency-temperature characteristic of the resonator 10. Specifically, the frequency-temperature characteristic is a frequency-temperature characteristic of the AT-cut quartz crystal resonator 10, for example. As illustrated in FIG. 17, the resonator 10 has a frequency-temperature characteristic approximated by using a cubic curve. When the capacitance is to be adjusted with respect to the resonator 10 by using the second variable capacitance circuit 32 having a negative voltage capacitance characteristic, the temperature compensation circuit 40 needs to output the temperature compensation voltage VCP having a temperature characteristic as illustrated in FIG. 18, for example. In this way, when the oscillation frequency of the resonator 10 increases in a high temperature range as indicated by A1 in FIG. 17, the temperature compensation voltage VCP output from the temperature compensation circuit 40 decreases as indicated by A2 in FIG. 18. Accordingly, the capacitance of the second variable capacitance circuit 32 having a negative characteristic increases, and the increase in the oscillation frequency of the resonator 10 is canceled out, whereby temperature compensation for maintaining the oscillation frequency constant can be implemented.

However, in order to sufficiently decrease the temperature compensation voltage VCP in a high temperature range indicated by A2 in FIG. 18, it is necessary to widen a low-voltage-side operation range of an output amplifier of the temperature compensation circuit 40. Therefore, in an amplifier circuit for a class A operation illustrated in FIG. 21 to be described later, for the output amplifier of the temperature compensation circuit 40, it is difficult to widen the low-voltage-side operation range, and it is necessary to use an amplifier circuit for a class AB operation illustrated in FIG. 22 to be described later, which complicates the circuit and increases the circuit scale.

Figure 19:
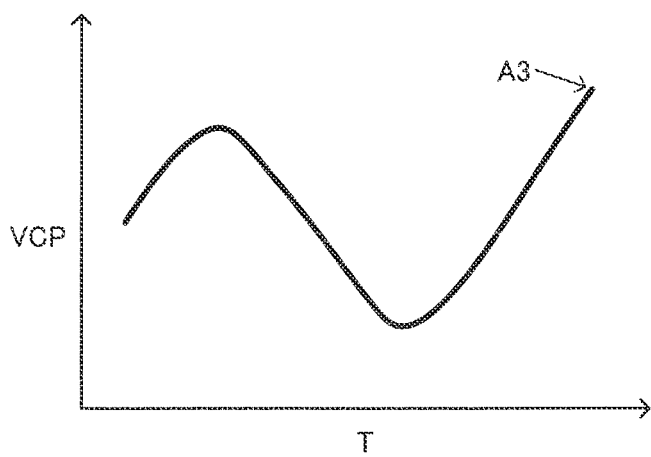
FIG. 19 is a graph illustrating an example of the temperature characteristic of the temperature compensation voltage in a case where the first variable capacitance circuit having a positive characteristic is used.

On the other hand, when the capacitance is to be adjusted with respect to the resonator 10 by using the first variable capacitance circuit 31 having a positive voltage capacitance characteristic, the temperature compensation circuit 40 may output the temperature compensation voltage VCP having a temperature characteristic as illustrated in FIG. 19, for example. In this way, when the oscillation frequency of the resonator 10 increases in the high temperature range as indicated by A1 in FIG. 17, the temperature compensation voltage VCP output from the temperature compensation circuit 40 increases as indicated by A3 in FIG. 19. Accordingly, the capacitance of the second variable capacitance circuit 31 having a positive characteristic increases, and the increase in the oscillation frequency of the resonator 10 is canceled out, whereby temperature compensation for maintaining the oscillation frequency constant can be implemented.

In this case, in the high temperature range indicated by A3 in FIG. 19, in order to output a high temperature compensation voltage VCP from the temperature compensation circuit 40, it is necessary to widen a high-voltage-side operation range of the output amplifier. In this regard, even in the amplifier circuit for a class A operation illustrated in FIG. 21 to be described later, since a P-type drive transistor constituting an output part is sufficiently turned on, the high temperature compensation voltage VCP as indicated by A3 in FIG. 19 can also be appropriately output. Therefore, it is not essential to use the amplifier circuit for a class AB operation as illustrated in FIG. 22 as the output amplifier of the temperature compensation circuit 40, and it is possible to achieve a reduction in scale and simplification of the circuit.

As described above, the temperature compensation circuit 40 according to the present embodiment can include an amplifier circuit for a class A operation that outputs the temperature compensation voltage VCP. The amplifier circuit for a class A operation is an amplifier circuit including, for example, a differential part having a differential input and an output part coupled to the differential part, and the output part includes a P-type drive transistor and a transistor for current source that are coupled in series between a high potential side power supply node and a low potential side power supply node. In this way, appropriate temperature compensation for the oscillation frequency in a wide temperature range can be implemented by the temperature compensation circuit 40 including the amplifier circuit for a class A operation, which has a smaller circuit scale and a simpler configuration as compared with the amplifier circuit for a class AB operation, and it is possible to achieve both appropriate temperature compensation and a reduction in circuit scale.

For example, the resonator 10 has a frequency-temperature characteristic approximated by using the cubic curve as illustrated in FIG. 17. For example, the resonator 10 has a frequency-temperature characteristic approximated by using a polynomial such as a cubic polynomial. The resonator 10 is a resonator in which, in a state where temperature compensation is not performed as illustrated in FIG. 17, an oscillation frequency fh at an upper limit of an operating temperature range indicated by A1 is larger than a local maximum value fa of the oscillation frequency indicated by A4. The operating temperature range is a temperature range in which specification characteristics can be satisfied in the oscillator 4 and the circuit device 20.

For example, according to the cubic frequency-temperature characteristic of the resonator 10 illustrated in FIG. 17, the oscillation frequency has the local maximum value fa at a temperature Ta as indicated by A4, and the oscillation frequency has a local minimum value fb at a temperature Tb as indicated by A5. The cubic frequency-temperature characteristic of the resonator 10 has an inflection point in the vicinity of, for example, 25° C. between the temperature Ta and the temperature Tb. Therefore, of the operating temperature range, a temperature range on the high temperature side is wider than a temperature range on the low temperature side. For example, when the operating temperature range is −40° C. to 125° C., the temperature range on the high temperature side is 25° C. to 125° C., which is wider than a range of −40° C. to 25° C., which is the temperature range on the low temperature side. The same applies to a case where the operating temperature range is −40° C. to 100° C. The oscillation frequency fh indicated by A1 in FIG. 17 is an oscillation frequency at the upper limit of the operating temperature range, and is, for example, an oscillation frequency at the upper limit in a range of 100° C. to 125° C. Therefore, in FIG. 17, a relationship that the oscillation frequency fh at the upper limit of the operating temperature range is larger than the local maximum value fa of the oscillation frequency is established. In this way, in the resonator 10 in which the oscillation frequency fh at the upper limit of the operating temperature range is larger than the local maximum value fa of the oscillation frequency, the temperature range on the high temperature side is wider than the temperature range on the low temperature side.

Therefore, when the second variable capacitance circuit 32 having a negative characteristic is used as a variable capacitance circuit to which the temperature compensation voltage VCP is input, in order to sufficiently decrease the temperature compensation voltage VCP at the upper limit of the operating temperature range as indicated by A2 in FIG. 18, it is necessary to widen the low-voltage-side operation range of the output amplifier of the temperature compensation circuit 40, and an amplifier circuit for a class AB operation is necessary. In contrast, in the present embodiment, the first variable capacitance circuit 31 having a positive characteristic is used as the variable capacitance circuit to which the temperature compensation voltage VCP is input. Therefore, even when an amplifier circuit for a class A operation is used as the output amplifier of the temperature compensation circuit 40, the temperature compensation voltage VCP can be sufficiently increased at the upper limit of the operating temperature range as indicated by A3 in FIG. 19, and it is possible to achieve both appropriate temperature compensation and a reduction in circuit scale.

4. Temperature Compensation Circuit

Figure 20:
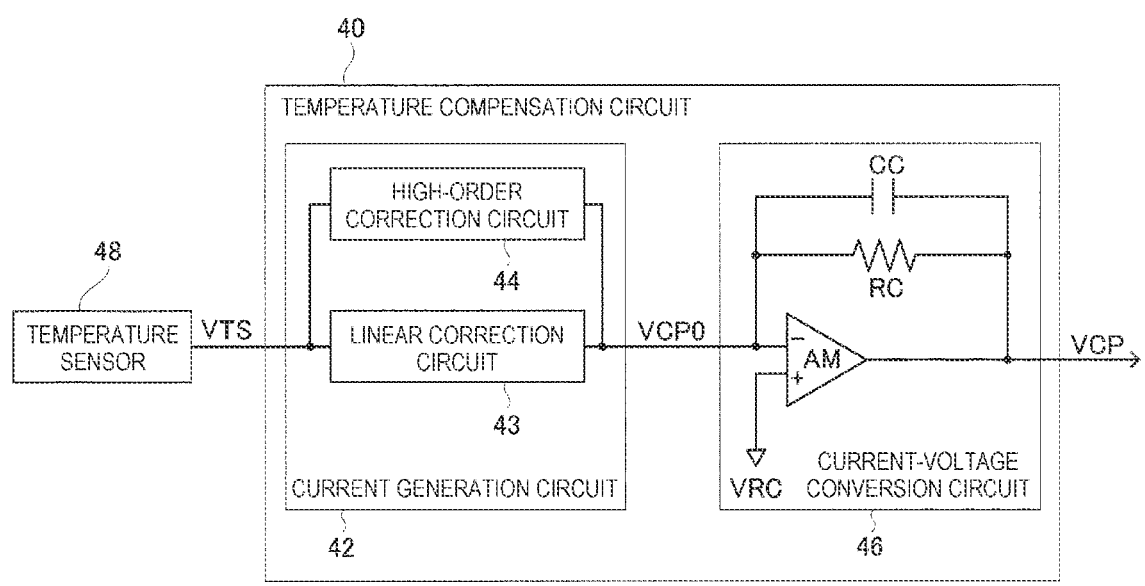
FIG. 20 is a diagram illustrating a configuration example of a temperature compensation circuit.

FIG. 20 is a diagram illustrating a configuration example of the temperature compensation circuit 40. The temperature compensation circuit 40 is not limited to the configuration in FIG. 20, and various modifications such as omitting some of the components, adding other components, and replacing some of the components with other components can be made.

The temperature compensation circuit 40 is a circuit that outputs the temperature compensation voltage VCP according to polynomial approximation using a temperature as a variable. The temperature compensation circuit 40 includes a current generation circuit 42 and a current-voltage conversion circuit 46. The current generation circuit 42 generates a function current based on a temperature detection result of the temperature sensor 48. For example, the current generation circuit 42 generates a function current for temperature compensating the frequency-temperature characteristic of the resonator 10 as illustrated in FIG. 17, based on a temperature detection voltage VTS that is a temperature detection result from the temperature sensor 48. The current-voltage conversion circuit 46 converts the function current from the current generation circuit 42 into a voltage and outputs the temperature compensation voltage VCP. Specifically, the current-voltage conversion circuit 46 outputs the temperature compensation voltage VCP by an amplifier circuit AM for a class A operation.

The current generation circuit 42 includes a linear correction circuit 43 and a high-order correction circuit 44. The linear correction circuit 43 outputs, based on the temperature detection voltage VTS, a linear current approximating a linear function. For example, the linear correction circuit 43 outputs a linear function current based on linear correction data corresponding to a linear coefficient of a polynomial in polynomial approximation. The linear correction circuit 43 includes, for example, an operational amplifier, a first variable resistance circuit, a second variable resistance circuit, and a third variable resistance circuit. The operational amplifier, the first variable resistance circuit, and the second variable resistance circuit constitute a non-inverting amplifier circuit. The non-inverting amplifier circuit amplifies the temperature detection voltage VTS with reference to a reference voltage VRC, for example. The non-inverting amplifier circuit outputs the linear current to an input node of the current-voltage conversion circuit 46 via the third variable resistance circuit.

The high-order correction circuit 44 outputs, based on the temperature detection voltage VTS, a high-order current approximating a high-order function to the current-voltage conversion circuit 46. For example, the high-order correction circuit 44 outputs a high-order current based on high-order correction data corresponding to a high-order coefficient of a polynomial in polynomial approximation. As an example, the high-order correction circuit 44 outputs a cubic current that approximates a cubic function. In this case, the high-order correction circuit 44 includes a first differential circuit that performs a differential operation based on the temperature detection voltage VTS, and a second differential circuit that performs a differential operation based on an output voltage of the first differential circuit and the temperature detection voltage VTS to output a cubic current. In FIG. 20, the temperature sensor 48 performs offset correction on the temperature detection voltage VTS based on zero-order correction data corresponding to a zero-order coefficient of a polynomial. That is, the temperature sensor 48 adjusts the offset of the temperature detection voltage VTS by offset indicated by the zero-order correction data. The offset correction on the temperature detection voltage VTS corresponds to zero-order correction in the temperature compensation for the oscillation frequency. The high-order correction circuit 44 may further include a correction circuit that performs fourth-order or higher-order correction. For example, the high-order correction circuit 44 may further include a quartic correction circuit that outputs a quartic current approximating a quartic function, a quintic correction circuit that outputs a quintic current approximating a quintic function, and the like.

The current-voltage conversion circuit 46 adds the linear current and the high-order current, and performs current-voltage conversion on the added current to output the temperature compensation voltage VCP. Accordingly, the temperature compensation voltage VCP that approximates a polynomial function is generated.

The current-voltage conversion circuit 46 includes an amplifier circuit AM, a resistor RC, and a capacitor CC. The amplifier circuit AM is implemented by an operational amplifier. The resistor RC and the capacitor CC are coupled in parallel between an output terminal and an inverting input terminal of the amplifier circuit AM. The reference voltage VRC is input to a non-inverting input terminal of the amplifier circuit AM. Accordingly, the current-voltage conversion circuit 46 outputs the temperature compensation voltage VCP by, for example, the amplifier circuit AM for a class A operation.

According to the temperature compensation circuit 40 having such a configuration, the function current generated by the current generation circuit 42 based on the temperature detection result of the temperature sensor 48 can be converted into a voltage and output as the temperature compensation voltage VCP by the current-voltage conversion circuit 46. Since the current-voltage conversion circuit 46 outputs the temperature compensation voltage by the amplifier circuit AM for a class A operation, the temperature compensation voltage VCP for performing appropriate temperature compensation for the oscillation frequency in a wide temperature range can be output by the amplifier circuit AM for a class A operation that has a small circuit scale and a simple configuration.

Figure 21:
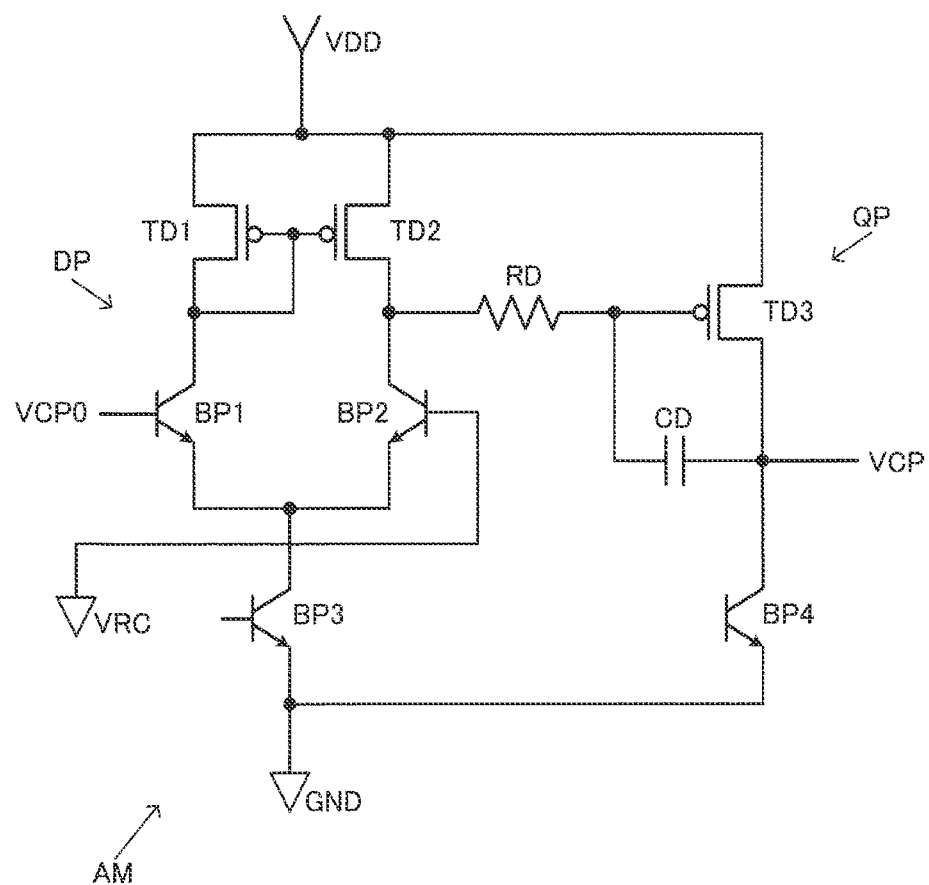
FIG. 21 is a diagram illustrating a configuration example of an amplifier circuit for a class A operation.
Figure 22:
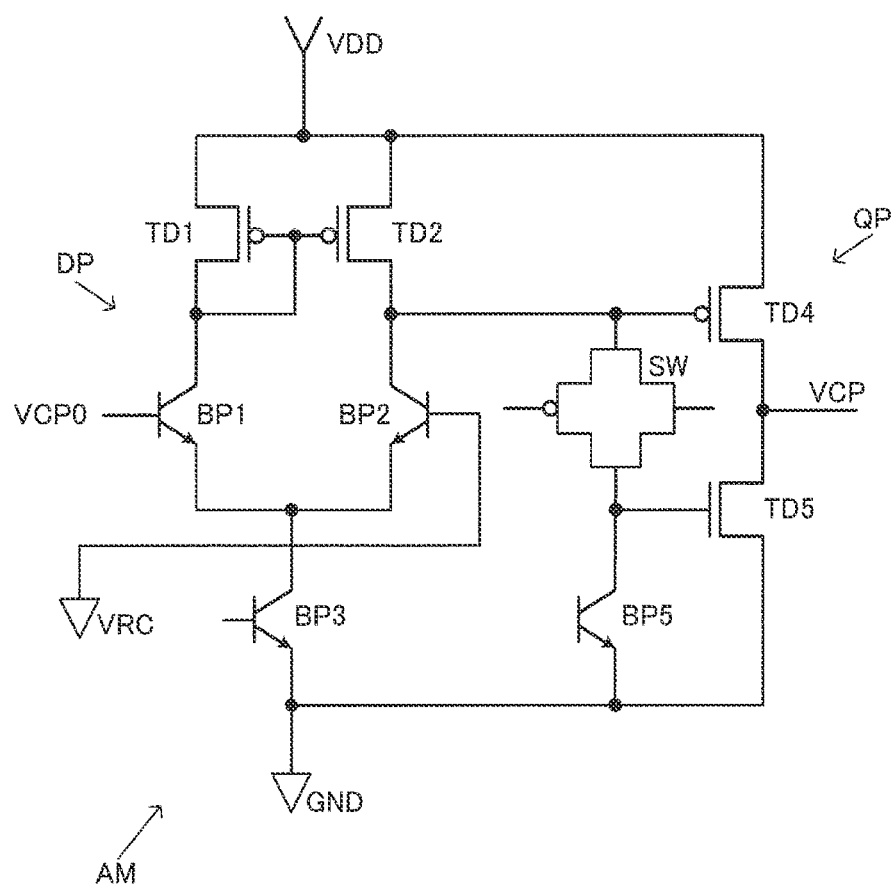
FIG. 22 is a diagram illustrating a configuration example of the amplifier circuit for a class AB operation.

FIG. 21 is a diagram illustrating a configuration example of the amplifier circuit AM for a class A operation. The amplifier circuit AM includes a differential part DP and an output part QP. The differential part DP includes transistors TD1 and TD2 constituting a current mirror circuit, bipolar transistors BP1 and BP2 that are transistors as a differential pair, and a bipolar transistor BP3 for a current source. The transistors TD1 and TD2 are P-type transistors whose gates are commonly coupled. A voltage VCP0 from the current generation circuit 42 is input to an inverting input terminal that is a base of the bipolar transistor BP1, and the reference voltage VRC is input to a non-inverting input terminal that is a base of the bipolar transistor BP2. The output part QP includes a P-type drive transistor TD3 and a bipolar transistor BP4 for a current source, which are provided in series between a VDD node and a GND node. The amplifier circuit AM is provided with a resistor RD for phase compensation and a capacitor CD. Note that MOS transistors may be used instead of the bipolar transistors BP1 to BP4.

On the other hand, FIG. 22 is a diagram illustrating a configuration example of the amplifier circuit AM for a class AB operation. FIG. 22 is different from FIG. 21 in that the output part QP includes a P-type drive transistor TD4 and an N-type drive transistor TD5 that are provided in series between a VDD node and a GND node. Further, in FIG. 22, a switch circuit SW for controlling a gate of the drive transistor TD5 and a bipolar transistor BP5 are provided.

In the present embodiment, in order to perform temperature compensation on the frequency-temperature characteristic of the resonator 10 illustrated in FIG. 17, the first variable capacitance circuit 31 having a positive voltage capacitance characteristic is used in the first mode. Therefore, the temperature compensation circuit 40 outputs the temperature compensation voltage VCP having the temperature characteristic as illustrated in FIG. 19. In this case, the amplifier circuit AM of the temperature compensation circuit 40 needs to output a sufficiently high voltage at the upper limit of the operating temperature range as indicated by A3 in FIG. 19. Even when the amplifier circuit AM for a class A operation illustrated in FIG. 21 is used as the output amplifier of the temperature compensation circuit 40, a high voltage as indicated by A3 in FIG. 19 can be easily output by sufficiently turning on the P-type drive transistor TD3 of the output part QP. Therefore, it is not essential to use the amplifier circuit AM for a class AB operation as illustrated in FIG. 22, and thus a reduction in scale and simplification of the circuit can be achieved.

5. Frequency Control Circuit

Figure 23:
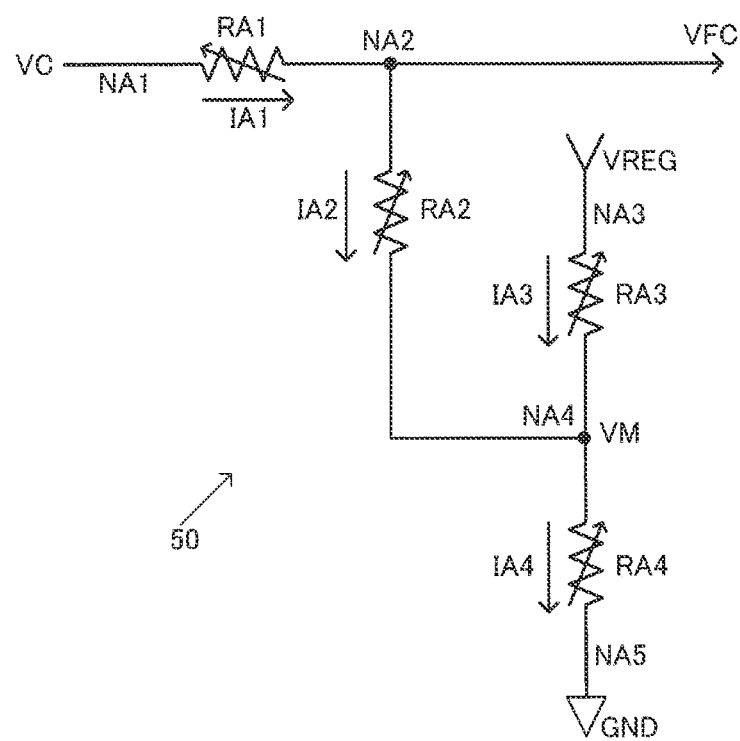
FIG. 23 is a diagram illustrating a configuration example of a frequency control circuit.

Next, the frequency control circuit 50 will be described in detail. FIG. 23 is a diagram illustrating a configuration example of the frequency control circuit 50. The frequency control circuit 50 is not limited to the configuration in FIG. 23, and various modifications such as omitting some of the components, adding other components, and replacing some of the components with other components can be made.

The frequency control circuit 50 according to the present embodiment outputs, as the frequency control voltage VFC, a voltage generated by dividing the control voltage VC, which is input from the outside, using at least one variable resistor. For example, the frequency control circuit 50 generates the frequency control voltage VFC by dividing the control voltage VC using a variable resistor, without using an amplifier implemented by an operational amplifier or the like. For example, when an amplifier is used for gain adjustment of the frequency control circuit 50, the circuit scale increases, the power consumption increases, and noise increases with an increase in the number of transistors. In this regard, the frequency control circuit 50 in FIG. 23 outputs, as the frequency control voltage VFC, a voltage generated by dividing the control voltage VC using a variable resistor. In this way, the oscillation frequency can be controlled by the frequency control voltage VFC without using an amplifier that has a large circuit scale, a high power consumption and much noise, and thus a reduction in scale, a reduction in power consumption, a reduction in noise, and the like of the circuit device 20 can be achieved.

In particular, in the present embodiment, in the fifth mode such as the inverted VCXO mode in FIG. 6, the switch circuit 36 outputs the frequency control voltage VFC to the first output terminal TQ1, and outputs a fixed voltage or the like to the second output terminal TQ2. Therefore, the frequency control voltage VFC is output as the first output voltage VQ1 to the first variable capacitance circuit 31 having a positive characteristic. Accordingly, it is possible to perform the frequency control by using the frequency control voltage VFC with a characteristic of polarity opposite to that of the normal VCXO, and it is possible to implement the inverted VCXO or the like in which inverted frequency control is performed. In the inverted VCXO, when the frequency control voltage VFC increases, the capacitance of the first variable capacitance circuit 31 having a positive characteristic to which the frequency control voltage VFC is input increases and the oscillation frequency decreases, and when the frequency control voltage VFC decreases, the capacitance of the first variable capacitance circuit 31 decreases and the oscillation frequency increases. Therefore, as illustrated in FIG. 23, even when the frequency control circuit 50 having a configuration in which an amplifier such as an inverting amplifier is not provided is used, it is possible to implement the inverted VCXO in which the oscillation frequency decreases when the frequency control voltage VFC increases and the oscillation frequency increases when the frequency control voltage VFC decreases.

Specifically, the frequency control circuit 50 in FIG. 23 includes a first variable resistor RA1, a second variable resistor RA2, a third variable resistor RA3, and a fourth variable resistor RA4. The first variable resistor RA1 is provided between an input node NA1 of the control voltage VC and an output node NA2 of the frequency control voltage VFC. One end of the second variable resistor RA2 is coupled to the output node NA2 of the frequency control voltage VFC. The third variable resistor RA3 is provided between an input node NA3 of a reference voltage VREG and a coupling node NA4 to which the other end of the second variable resistor RA2 is coupled. The fourth variable resistor RA4 is provided between the coupling node NA4 and a low potential power supply node NA5. The low potential power supply node NA5 is, for example, a GND node.

In the frequency control circuit 50 in FIG. 23, currents IA1, IA2, IA3, and IA4 flowing through the first variable resistor RA1, the second variable resistor RA2, the third variable resistor RA3, and the fourth variable resistor RA4 respectively are obtained using the following equations (1), (2), and (3).

$$IA1 = IA2 = \frac{VC - VM}{RA1 + RA2} = \frac{VC - VFC}{RA1} = \frac{VFC - VM}{RA2} \quad (1)$$

$$IA3 = \frac{VREG - VM}{RA3} \quad (2)$$

$$IA4 = IA2 + IA3 = \frac{VC - VM}{RA1 + RA2} + \frac{VREG - VM}{RA3} \quad (3)$$

Accordingly, the voltage VM at the coupling node NA4, which is a voltage division node between the third variable resistor RA3 and the fourth variable resistor RA4, is obtained by the following equations (4) and (5).

$$VM = RA4 \times IA4 = RA4 \times \left(\frac{VC - VM}{RA1 + RA2} + \frac{VREG - VM}{RA3}\right) \quad (4)$$

$$VM = \frac{(RA1 + RA2) \times RA3 \times RA4}{(RA1 + RA2) \times (RA3 + RA4) + RA3 \times RA4} \times \left(\frac{VC}{RA1 + RA2} + \frac{VREG}{RA3}\right) \quad (5)$$

Therefore, the frequency control voltage VFC can be obtained using the following equations (6) and (7).

$$VFC = \frac{RA2}{RA1+RA2} \times VC + \frac{RA1}{RA1+RA2} \times VM \quad (6)$$

$$VFC = \frac{(RA2(RA3+RA4)+RA3 \times RA4)VC + RA1 \times RA4 \times VREG}{(RA1+RA2) \times (RA3+RA4)+RA3 \times RA4} \quad (7)$$

Then, G=ΔVFC/ΔVC, which is gain in the frequency control circuit 50, is expressed by the following equation (8).

$$G = \frac{\Delta VFC}{\Delta VC} = \frac{RA2(RA3+RA4)+RA3 \times RA4}{(RA1+RA2) \times (RA3+RA4)+RA3 \times RA4} > 0 \quad (8)$$

As shown in the above equation (8), according to the frequency control circuit 50 of the present embodiment, it is possible to adjust the gain G of the frequency control voltage VFC with respect to the control voltage VC with a small-scale circuit configuration that does not use an amplifier. For example, the gain G in the frequency control circuit 50 can be adjusted by adjusting resistance values of the first variable resistor RA1 to the fourth variable resistor RA4. Therefore, the gain G of the frequency control voltage VFC with respect to the control voltage VC can be adjusted to any value without using an amplifier that has a large circuit scale, a high power consumption and much noise.

6. Oscillator

Figure 24:
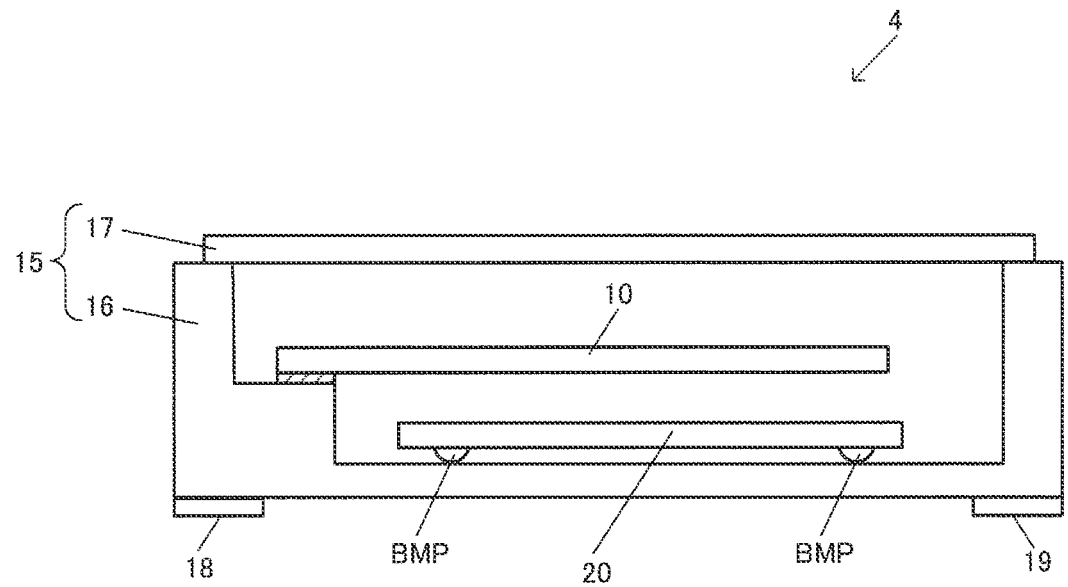
FIG. 24 is a diagram illustrating a first structure example of the oscillator.

FIG. 24 is a diagram illustrating a first structure example of the oscillator 4 according to the present embodiment. The oscillator 4 includes the resonator 10, the circuit device 20, and a package 15 that accommodates the resonator 10 and the circuit device 20. The package 15 is made of, for example, ceramic, and has an accommodating space on an inner side. The resonator 10 and the circuit device 20 are accommodated in the accommodating space. The accommodating space is hermetically sealed, and is desirably in a depressurized state that is a state close to vacuum. With the package 15, the resonator 10 and the circuit device 20 can be appropriately protected from impact, dust, heat, moisture, and the like.

The package 15 includes a base 16 and a lid 17. Specifically, the package 15 includes the base 16 that supports the resonator 10 and the circuit device 20, and the lid 17 that is joined to an upper surface of the base 16 such that the accommodating space is defined between the base 16 and the lid 17. The resonator 10 is supported by a step portion, which is provided at an inner side of the base 16, via a terminal electrode. The circuit device 20 is disposed on an inner bottom surface of the base 16. Specifically, the circuit device 20 is disposed such that an active surface thereof faces the inner bottom surface of the base 16. The active surface is a surface at which a circuit element of the circuit device 20 is formed. Bumps BMP are formed at terminals of the circuit device 20. The circuit device 20 is supported by the inner bottom surface of the base 16 via the conductive bumps BMP. The conductive bumps BMP are, for example, metal bumps, and the resonator 10 is electrically coupled to the circuit device 20 via the bumps BMP, an internal wiring of the package 15, a terminal electrode, and the like. The circuit device 20 is electrically coupled to external terminals 18 and 19 of the oscillator 4 via the bumps BMP and the internal wiring of the package 15. The external terminals 18 and 19 are formed at an outer bottom surface of the package 15. The external terminals 18 and 19 are coupled to an external device via an external wiring. The external wiring is, for example, a wiring formed at a circuit board mounted on the external device. Accordingly, a clock signal or the like can be output to the external device.

Although the circuit device 20 is flip mounted such that the active surface of the circuit device 20 faces downward in FIG. 24, the present embodiment is not limited to such mounting. For example, the circuit device 20 may be mounted such that the active surface of the circuit device 20 faces upward. That is, the circuit device 20 is mounted such that the active surface faces the resonator 10.

Figure 25:
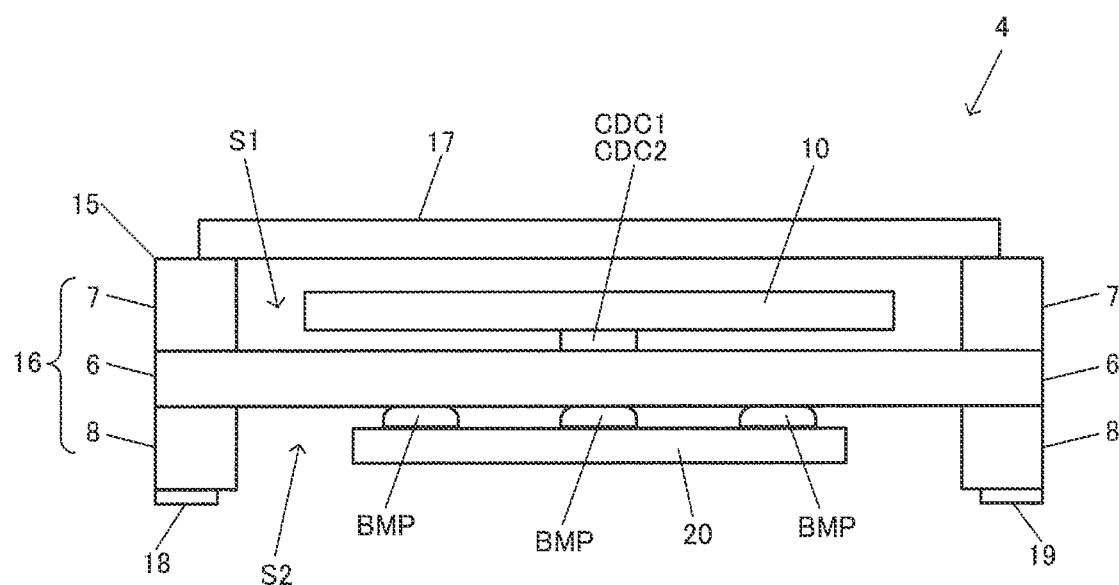
FIG. 25 is a diagram illustrating a second structure example of the oscillator.

FIG. 25 is a diagram illustrating a second structure example of the oscillator 4. The oscillator 4 includes the resonator 10, the circuit device 20, and the package 15 that accommodates the resonator 10 and the circuit device 20. The package 15 includes the base 16 and the lid 17. The base 16 includes a first substrate 6 that is an intermediate substrate, a second substrate 7 having a substantially rectangular frame shape that is laminated on an upper surface side of the first substrate 6, and a third substrate 8 having a substantially rectangular frame shape that is laminated on a bottom surface side of the first substrate 6. The lid 17 is joined to an upper surface of the second substrate 7, and the resonator 10 is accommodated in an accommodating space S1 that is defined by the first substrate 6, the second substrate 7, and the lid 17. For example, the resonator 10 is hermetically sealed in the accommodating space S1, and the accommodating space S1 is desirably in a depressurized state that is a state close to vacuum. Accordingly, the resonator 10 can be appropriately protected from impact, dust, heat, moisture, and the like. The circuit device 20 that is a semiconductor chip is accommodated in an accommodating space S2 defined by the first substrate 6 and the third substrate 8. The external terminals 18 and 19 that are external coupling electrode terminals of the oscillator 4 are formed at a bottom surface of the third substrate 8.

In the accommodating space S1, the resonator 10 is coupled to, by conductive coupling portions CDC1 and CDC2, a first electrode terminal and a second electrode terminal (not illustrated) formed at an upper surface of the first substrate 6. For example, the conductive coupling portions CDC1 and CDC2 may be implemented by conductive bumps such as metal bumps, or may be implemented by conductive adhesives. Specifically, for example, a first electrode pad (not illustrated) formed at one end of the tuning-fork type resonator 10 is coupled to, via the conductive coupling portion CDC1, the first electrode terminal formed at the upper surface of the first substrate 6. The first electrode terminal is electrically coupled to the pad PX1 of the circuit device 20. A second electrode pad (not illustrated) formed at the other end of the tuning-fork type resonator 10 is coupled to, via the conductive coupling portion CDC2, the second electrode terminal formed at the upper surface of the first substrate 6. The second electrode terminal is electrically coupled to the pad PX2 of the circuit device 20. Accordingly, the one end and the other end of the resonator 10 can be electrically coupled to the pads PX1 and PX2 of the circuit device 20 via the conductive coupling portions CDC1 and CDC2. The conductive bumps BMP are formed at a plurality of pads of the circuit device 20 that is a semiconductor chip, and these conductive bumps BMP are coupled to a plurality of electrode terminals formed at a bottom surface of the first substrate 6. The electrode terminals coupled to the pads of the circuit device 20 are electrically coupled to the external terminals 18 and 19 of the oscillator 4 via an internal wiring or the like.

The oscillator 4 may be an oscillator of a wafer level package (WLP). In this case, the oscillator 4 includes: a base that includes a semiconductor substrate and a penetration electrode penetrating between a first surface and a second surface of the semiconductor substrate; the resonator 10 that is fixed to the first surface of the semiconductor substrate via a conductive joining member such as a metal bump; and an external terminal that is provided at a second surface side of the semiconductor substrate via an insulating layer such as a re-wiring layer. An integrated circuit serving as the circuit device 20 is formed at the first surface or the second surface of the semiconductor substrate. In this case, by bonding a first semiconductor wafer disposed with a plurality of bases, each having the resonator 10 and the integrated circuit, to a second semiconductor wafer formed with a plurality of lids, the plurality of bases are joined to the plurality of lids, and then dicing of the oscillators 4 is performed using a dicing saw or the like. In this way, the oscillator 4 of the wafer level package can be implemented, and the oscillator 4 can be manufactured with high throughput and low cost.

As described above, a circuit device according to the present embodiment includes an oscillation circuit. The oscillation circuit includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and oscillates a resonator. The circuit device further includes a switch circuit. The switch circuit receives a first input voltage at a first input terminal thereof, receives a second input voltage at a second input terminal thereof, outputs a first output voltage selected from a plurality of voltages including the first input voltage and the second input voltage to a first output terminal thereof to which the first variable capacitance circuit is electrically coupled, and outputs a second output voltage selected from the plurality of voltages to a second output terminal thereof to which the second variable capacitance circuit is electrically coupled.

According to the present embodiment, voltages selected from the plurality of voltages including the first input voltage and the second input voltage can be output as the first output voltage and the second output voltage to the first variable capacitance circuit and the second variable capacitance circuit, respectively. The first output voltage can be input as a capacitance control voltage to the first variable capacitance circuit having a positive voltage capacitance characteristic to adjust or set an oscillation frequency of the oscillation circuit, or the second output voltage can be input as a capacitance control voltage to the second variable capacitance circuit having a negative voltage capacitance characteristic to adjust or set the oscillation frequency of the oscillation circuit. Accordingly, it is possible to provide a circuit device or the like capable of implementing various operation modes by using the first variable capacitance circuit and the second variable capacitance circuit having different polarities of voltage capacitance characteristics.

In the present embodiment, a temperature compensation circuit that outputs a temperature compensation voltage for temperature compensating an oscillation frequency of the oscillation circuit may be provided, and the first input voltage may be the temperature compensation voltage.

In this way, the temperature compensation voltage from the temperature compensation circuit is input as the first input voltage to the first input terminal, and the switch circuit can output, as the first output voltage, the temperature compensation voltage to the first variable capacitance circuit having a positive characteristic, or output, as the second output voltage, the temperature compensation voltage to the second variable capacitance circuit having a negative characteristic.

In the present embodiment, a frequency control circuit that outputs a frequency control voltage for an oscillation frequency of the oscillation circuit may be provided, and the second input voltage may be the frequency control voltage.

In this way, in the switch circuit, the frequency control voltage from the frequency control circuit is input as the second input voltage to the second input terminal, and the switch circuit can output, as the second output voltage, the frequency control voltage to the second variable capacitance circuit having a negative characteristic, or output, as the first output voltage, the frequency control voltage to the first variable capacitance circuit having a positive characteristic.

In the present embodiment, the plurality of voltages may include a fixed voltage, and the switch circuit may output the fixed voltage to the first output terminal or the second output terminal.

In this way, when the switch circuit outputs the fixed voltage to the first output terminal or the second output terminal, a capacitance of the first variable capacitance circuit or the second variable capacitance circuit can be set to a fixed capacitance.

In the present embodiment, the switch circuit may output, as the fixed voltage, a high potential side fixed voltage or a low potential side fixed voltage to the first output terminal or the second output terminal.

In this way, the capacitance of the first variable capacitance circuit and the second variable capacitance circuit can be fixed to a high capacitance or a low capacitance.

In the present embodiment, a temperature compensation circuit that outputs a temperature compensation voltage for temperature compensating an oscillation frequency of the oscillation circuit, based on a temperature detection result of a temperature sensor, and a frequency control circuit that outputs a frequency control voltage for the oscillation frequency may be provided. In a first mode, the switch circuit may output the temperature compensation voltage to the first output terminal and output the frequency control voltage to the second output terminal.

In this way, the temperature compensation voltage from the temperature compensation circuit is supplied to the first variable capacitance circuit having a positive characteristic, and the frequency control voltage from the frequency control voltage is supplied to the second variable capacitance circuit having a negative characteristic, and an operation mode in which both temperature compensation by using the temperature compensation voltage and frequency control by using the frequency control voltage are enabled can be implemented.

In the present embodiment, in a second mode, the switch circuit may output the temperature compensation voltage to the first output terminal and output a first fixed voltage to the second output terminal.

In this way, the temperature compensation voltage from the temperature compensation circuit is supplied to the first variable capacitance circuit having a positive characteristic, and the first fixed voltage is supplied as a capacitance control voltage to the second variable capacitance circuit, and an operation mode in which the temperature compensation by using the temperature compensation voltage is performed can be implemented.

In the present embodiment, in a third mode, the switch circuit may output a second fixed voltage to the first output terminal and output the frequency control voltage to the second output terminal.

In this way, the frequency control voltage from the frequency control circuit is supplied to the second variable capacitance circuit having a negative characteristic, and the second fixed voltage is supplied as the capacitance control voltage to the first variable capacitance circuit, and an operation mode in which the frequency control by using the frequency control voltage is performed can be implemented.

In the present embodiment, in a fourth mode, the switch circuit may output a third fixed voltage to the first output terminal and output a fourth fixed voltage to the second output terminal.

In this way, the third fixed voltage is supplied as the capacitance control voltage to the first variable capacitance circuit, and the fourth fixed voltage is supplied as the capacitance control voltage to the second variable capacitance circuit, and an operation mode in which the temperature compensation by using the temperature compensation voltage and the frequency control by using the frequency control voltage are not performed can be implemented.

In the present embodiment, in a fifth mode, the switch circuit may output the frequency control voltage to the first output terminal and output a fifth fixed voltage or the temperature compensation voltage to the second output terminal.

In this way, the frequency control voltage from the frequency control voltage is supplied to the first variable capacitance circuit having a positive characteristic, and the fifth fixed voltage or the temperature compensation voltage is supplied to the second variable capacitance circuit having a negative characteristic, and an operation mode can be implemented in which the oscillation frequency decreases when the frequency control voltage increases and the oscillation frequency increases when the frequency control voltage decreases.

In addition, in the present embodiment, a nonvolatile memory that stores setting information on voltage selection of the switch circuit may be provided.

In this way, a voltage selected by the switch circuit can be output as the first output voltage from the first output terminal or can be output as the second output voltage from the second output terminal, based on the setting information on voltage selection stored in the nonvolatile memory capable of storing information without power supply.

A circuit device according to the present embodiment includes an oscillation circuit and a frequency control circuit. The oscillation circuit includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and oscillates a resonator. The frequency control circuit outputs a frequency control voltage for an oscillation frequency of the oscillation circuit. In the circuit device according to the present embodiment, in a first mode, the frequency control voltage is input as the capacitance control voltage to the second variable capacitance circuit, and in a second mode, the frequency control voltage is input as the capacitance control voltage to the first variable capacitance circuit.

In this way, by setting the circuit device to the first mode, it is possible to implement an operation mode in which the oscillation frequency increases when the frequency control voltage increases and the oscillation frequency decreases when the frequency control voltage decreases. In addition, by setting the circuit device to the second mode, it is possible to implement an operation mode in which the oscillation frequency decreases when the frequency control voltage increases and the oscillation frequency increases when the frequency control voltage decreases.

An oscillator according to the present embodiment includes a resonator and a circuit device. The circuit device includes an oscillation circuit. The oscillation circuit includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and oscillates the resonator. The circuit device further includes a switch circuit. The switch circuit receives a first input voltage at a first input terminal thereof, receives a second input voltage at a second input terminal thereof, outputs a first output voltage selected from a plurality of voltages including the first input voltage and the second input voltage to a first output terminal thereof to which the first variable capacitance circuit is coupled, and outputs a second output voltage selected from the plurality of voltages to a second output terminal thereof to which the second variable capacitance circuit is coupled.

An oscillator according to the present embodiment includes a resonator and a circuit device. The circuit device includes an oscillation circuit and a frequency control circuit that outputs a frequency control voltage for an oscillation frequency of the oscillation circuit. The oscillation circuit includes a first variable capacitance circuit whose capacitance change characteristic with respect to a capacitance control voltage is a positive characteristic and a second variable capacitance circuit whose capacitance change characteristic with respect to the capacitance control voltage is a negative characteristic, and oscillates the resonator. In the oscillator according to the present embodiment, in a first mode, the frequency control voltage is input as the capacitance control voltage to the second variable capacitance circuit, and in a second mode, the frequency control voltage is input as the capacitance control voltage to the first variable capacitance circuit.

Although the present embodiment has been described in detail above, it will be easily understood by those skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the specification or in the drawings can be replaced with the different term in any place in the specification or in the drawings. In addition, all combinations of the present embodiment and the modifications are also included in the scope of the present disclosure. The configurations, operations, and the like of the circuit device and the oscillator are not limited to those described in the present embodiment, and various modifications can be made.

What is claimed is:

1. A circuit device, comprising:
   an oscillation circuit configured to oscillate a resonator, the oscillation circuit including:
     a first variable capacitance circuit whose capacitance change characteristic with respect to a first capacitance control voltage is a positive characteristic; and
     a second variable capacitance circuit whose capacitance change characteristic with respect a second capacitance control voltage is a negative characteristic;

a temperature compensation circuit configured to output a temperature compensation voltage for temperature compensating an oscillation frequency of the oscillation circuit;

a frequency control circuit configured to output a frequency control voltage for frequency controlling the oscillation frequency of the oscillation circuit; and a switch circuit configured to:
- receive the temperature compensation voltage at a first input terminal thereof;
- receive the frequency control voltage at a second input terminal thereof;
- output a first output voltage selected from a plurality of voltages to a first output terminal thereof to which the first variable capacitance circuit is electrically coupled; and
- output a second output voltage selected from the plurality of voltages to a second output terminal thereof to which the second variable capacitance circuit is electrically coupled, wherein the plurality of voltages include the temperature compensation voltage, the frequency control voltage, a reference voltage, and a ground voltage.

2. The circuit device according to claim 1, wherein
the plurality of voltages include a fixed voltage, and
the switch circuit outputs the fixed voltage to the first output terminal or the second output terminal.

3. The circuit device according to claim 2, wherein
the switch circuit outputs, as the fixed voltage, a high potential side fixed voltage or a low potential side fixed voltage to the first output terminal or the second output terminal.

4. The circuit device according to claim 1, wherein
in a first mode, the switch circuit outputs the temperature compensation voltage to the first output terminal and outputs the frequency control voltage to the second output terminal.

5. The circuit device according to claim 4, wherein
in a second mode, the switch circuit outputs the temperature compensation voltage to the first output terminal and outputs a first fixed voltage to the second output terminal.

6. The circuit device according to claim 4, wherein
in a third mode, the switch circuit outputs a second fixed voltage to the first output terminal and outputs the frequency control voltage to the second output terminal.

7. The circuit device according to claim 4, wherein
in a fourth mode, the switch circuit outputs a third fixed voltage to the first output terminal and outputs a fourth fixed voltage to the second output terminal.

8. The circuit device according to claim 4, wherein
in a fifth mode, the switch circuit outputs the frequency control voltage to the first output terminal and outputs a fifth fixed voltage or the temperature compensation voltage to the second output terminal.

9. The circuit device according to claim 1, further comprising:
a nonvolatile memory configured to store setting information on voltage selection of the switch circuit.

10. A circuit device, comprising:
an oscillation circuit configured to oscillate a resonator, the oscillation circuit including:
a first variable capacitance circuit whose capacitance change characteristic with respect to a first capacitance control voltage is a positive characteristic; and
a second variable capacitance circuit whose capacitance change characteristic with respect to a second capacitance control voltage is a negative characteristic;

a temperature compensation circuit configured to output a temperature compensation voltage for temperature compensating an oscillation frequency of the oscillation circuit; and a frequency control circuit configured to output a frequency control voltage for frequency controlling the oscillation frequency of the oscillation circuit, wherein in a first mode, the frequency control voltage is input as the second capacitance control voltage to the second variable capacitance circuit, and the temperature compensation voltage is input as the first capacitance control voltage to the first variable capacitance circuit, and in a second mode, the frequency control voltage is input as the first capacitance control voltage to the first variable capacitance circuit, and the temperature compensation voltage is input as the second capacitance control voltage to the second variable capacitance circuit.

11. An oscillator, comprising:
a resonator; and
a circuit device, the circuit device including:
an oscillation circuit configured to oscillate the resonator, the oscillation circuit including:
a first variable capacitance circuit whose capacitance change characteristic with respect to a first capacitance control voltage is a positive characteristic; and
a second variable capacitance circuit whose capacitance change characteristic with respect to a second capacitance control voltage is a negative characteristic;

a temperature compensation circuit configured to output a temperature compensation voltage for temperature compensating an oscillation frequency of the oscillation circuit;

a frequency control circuit configured to output a frequency control voltage for frequency controlling the oscillation frequency of the oscillation circuit; and a switch circuit configured to:
- receive the temperature compensation voltage at a first input terminal thereof;
- receive the frequency control voltage at a second input terminal thereof;
- output a first output voltage selected from a plurality of voltages to a first output terminal thereof to which the first variable capacitance circuit is coupled; and
- output a second output voltage selected from the plurality of voltages to a second output terminal to which the second variable capacitance circuit is coupled, wherein the plurality of voltages include the temperature compensation voltage, the frequency control voltage, a reference voltage, and a ground voltage.

12. An oscillator, comprising:
a resonator; and
a circuit device, the circuit device including:
an oscillation circuit configured to oscillate a resonator, the oscillation circuit including:

a first variable capacitance circuit whose capacitance change characteristic with respect to a first capacitance control voltage is a positive characteristic; and a second variable capacitance circuit whose capacitance change characteristic with respect to a second capacitance control voltage is a negative characteristic;

a temperature compensation circuit configured to output a temperature compensation voltage for temperature compensating an oscillation frequency of the oscillation circuit; and a frequency control circuit configured to output a frequency control voltage for frequency controlling the oscillation frequency of the oscillation circuit, wherein in a first mode, the frequency control voltage is input as the second capacitance control voltage to the second variable capacitance circuit, and the temperature compensation voltage is input as the first capacitance control voltage to the first variable capacitance circuit, and in a second mode, the frequency control voltage is input as the first capacitance control voltage to the first variable capacitance circuit, and the temperature compensation voltage is input as the second capacitance control voltage to the second variable capacitance circuit.

* * * * *